(12) United States Patent
Bauer et al.

(10) Patent No.: US 7,648,690 B2
(45) Date of Patent: Jan. 19, 2010

(54) METHODS OF MAKING SUBSTITUTIONALLY CARBON-DOPED CRYSTALLINE SI-CONTAINING MATERIALS BY CHEMICAL VAPOR DEPOSITION

(75) Inventors: Matthias Bauer, Phoenix, AZ (US);
Keith Doran Weeks, Gilbert, AZ (US);
Pierre Tomasini, Tempe, AZ (US);
Nyles Cody, Tempe, AZ (US)

(73) Assignee: ASM America Inc., Phoenix, AZ (US)

( * ) Notice: Subject to any disclaimer, the term of this patent is extended or adjusted under 35 U.S.C. 154(b) by 0 days.

(21) Appl. No.: 12/244,724

(22) Filed: Oct. 2, 2008

(65) Prior Publication Data

US 2009/0026496 A1  Jan. 29, 2009

Related U.S. Application Data

(62) Division of application No. 11/343,275, filed on Jan. 30, 2006, now Pat. No. 7,438,760.

(60) Provisional application No. 60/649,990, filed on Feb. 4, 2005, provisional application No. 60/663,434, filed on Mar. 18, 2005, provisional application No. 60/668,420, filed on Apr. 4, 2005.

(51) Int. Cl.
*C01B 33/00* (2006.01)
*C30B 29/02* (2006.01)

(52) U.S. Cl. ................ 423/324; 423/345; 423/348; 423/349; 117/928; 117/935

(58) Field of Classification Search ............... 423/324, 423/345, 348, 349; 117/928, 935
See application file for complete search history.

(56) References Cited

U.S. PATENT DOCUMENTS

| 4,058,430 A | 11/1977 | Suntola et al. |
| 4,413,022 A | 11/1983 | Suntola et al. |
| 4,747,367 A | 5/1988 | Posa |
| 4,761,269 A | 8/1988 | Conger et al. |
| 5,071,670 A | 12/1991 | Kelly |

(Continued)

FOREIGN PATENT DOCUMENTS

DE  19820147 A1  7/1999

(Continued)

OTHER PUBLICATIONS

Abeles et al.; *Amorphous Semiconductor Superlattices*; Physical Review Letters; Nov. 21, 1983; pp. 2003-2006; vol. 51; No. 21.

(Continued)

*Primary Examiner*—Robert M Kunemund
*Assistant Examiner*—G. Nagesh Rao
(74) *Attorney, Agent, or Firm*—Knobbe, Martens, Olson & Bear, LLP

(57) ABSTRACT

Methods of making Si-containing films that contain relatively high levels of substitutional dopants involve chemical vapor deposition using trisilane and a dopant precursor. Extremely high levels of substitutional incorporation may be obtained, including crystalline silicon films that contain 2.4 atomic % or greater substitutional carbon. Substitutionally doped Si-containing films may be selectively deposited onto the crystalline surfaces of mixed substrates by introducing an etchant gas during deposition.

27 Claims, 15 Drawing Sheets

U.S. PATENT DOCUMENTS

| | | | |
|---|---|---|---|
| 5,225,032 A | 7/1993 | Golecki | |
| 5,306,666 A | 4/1994 | Izumi | |
| 5,360,986 A * | 11/1994 | Candelaria | 257/183 |
| 5,674,781 A | 10/1997 | Huang et al. | |
| 5,711,811 A | 1/1998 | Suntola et al. | |
| 5,769,950 A | 6/1998 | Takasu et al. | |
| 5,831,335 A | 11/1998 | Miyamoto | |
| 5,837,580 A | 11/1998 | Thakur et al. | |
| 5,879,459 A | 3/1999 | Gadgil et al. | |
| 5,904,565 A | 5/1999 | Nguyen et al. | |
| 5,916,365 A | 6/1999 | Sherman | |
| 5,933,761 A | 8/1999 | Lee | |
| 6,037,258 A | 3/2000 | Liu et al. | |
| 6,042,654 A | 3/2000 | Comita et al. | |
| 6,048,790 A | 4/2000 | Iacoponi et al. | |
| 6,069,068 A | 5/2000 | Rathore et al. | |
| 6,077,775 A | 6/2000 | Stumborg et al. | |
| 6,083,818 A | 7/2000 | Stumborg et al. | |
| 6,093,368 A | 7/2000 | Chu et al. | |
| 6,100,184 A | 8/2000 | Zhao et al. | |
| 6,139,700 A | 10/2000 | Kang et al. | |
| 6,146,517 A | 11/2000 | Hoinkis | |
| 6,159,828 A | 12/2000 | Ping et al. | |
| 6,181,012 B1 | 1/2001 | Edelstein et al. | |
| 6,184,128 B1 | 2/2001 | Wang et al. | |
| 6,188,134 B1 | 2/2001 | Stumborg et al. | |
| 6,197,666 B1 | 3/2001 | Schafer et al. | |
| 6,197,669 B1 | 3/2001 | Twu et al. | |
| 6,200,893 B1 | 3/2001 | Sneh | |
| 6,203,613 B1 | 3/2001 | Gates et al. | |
| 6,207,487 B1 | 3/2001 | Kim et al. | |
| 6,207,567 B1 | 3/2001 | Wang et al. | |
| 6,225,213 B1 | 5/2001 | Urabe | |
| 6,270,572 B1 | 8/2001 | Kim et al. | |
| 6,287,965 B1 | 9/2001 | Kang et al. | |
| 6,291,876 B1 | 9/2001 | Stumborg et al. | |
| 6,303,523 B2 | 10/2001 | Cheung et al. | |
| 6,340,619 B1 | 1/2002 | Ko | |
| 6,342,448 B1 | 1/2002 | Lin et al. | |
| 6,351,039 B1 | 2/2002 | Jin et al. | |
| 6,358,829 B2 | 3/2002 | Yoon et al. | |
| 6,368,954 B1 | 4/2002 | Lopatin et al. | |
| 6,380,065 B1 | 4/2002 | Komai et al. | |
| 6,391,785 B1 | 5/2002 | Satta et al. | |
| 6,437,071 B1 | 8/2002 | Odaka et al. | |
| 6,444,495 B1 | 9/2002 | Leung et al. | |
| 6,482,733 B2 | 11/2002 | Raaijmakers et al. | |
| 6,531,347 B1 | 3/2003 | Huster | |
| 6,555,839 B2 | 4/2003 | Fitzgerald | |
| 6,583,015 B2 | 6/2003 | Fitzgerald et al. | |
| 6,583,048 B1 | 6/2003 | Vincent et al. | |
| 6,593,191 B2 | 7/2003 | Fitzgerald | |
| 6,716,713 B2 | 4/2004 | Todd | |
| 6,727,169 B1 | 4/2004 | Raaijmakers et al. | |
| 6,821,825 B2 | 11/2004 | Todd et al. | |
| 6,900,115 B2 | 5/2005 | Todd | |
| 6,958,253 B2 | 10/2005 | Todd | |
| 6,962,859 B2 | 11/2005 | Todd et al. | |
| 6,969,875 B2 | 11/2005 | Fitzgerald | |
| 7,026,219 B2 | 4/2006 | Pomarede et al. | |
| 7,186,630 B2 | 3/2007 | Todd | |
| 7,332,439 B2 | 2/2008 | Lindert | |
| 2001/0001742 A1 | 5/2001 | Huang et al. | |
| 2001/0034123 A1 | 10/2001 | Jeon et al. | |
| 2002/0023520 A1 | 2/2002 | Hu | |
| 2002/0168868 A1 | 11/2002 | Todd | |
| 2002/0173113 A1 | 11/2002 | Todd | |
| 2003/0047129 A1 | 3/2003 | Kawahara | |
| 2003/0219981 A1 | 11/2003 | Ammon et al. | |
| 2004/0224089 A1 | 11/2004 | Singh et al. | |
| 2004/0224504 A1 | 11/2004 | Gadgil | |
| 2004/0262694 A1 | 12/2004 | Chidambaram | |
| 2005/0023520 A1 | 2/2005 | Lee et al. | |
| 2005/0042888 A1 | 2/2005 | Roeder et al. | |
| 2005/0079692 A1 | 4/2005 | Samoilov et al. | |
| 2005/0121719 A1 | 6/2005 | Mori | |
| 2005/0250298 A1 | 11/2005 | Bauer | |
| 2006/0011984 A1 | 1/2006 | Currie | |
| 2006/0014366 A1 | 1/2006 | Currie | |
| 2006/0115933 A1 | 6/2006 | Ye et al. | |
| 2006/0115934 A1 | 6/2006 | Kim et al. | |
| 2006/0148151 A1 | 7/2006 | Murthy et al. | |
| 2006/0166414 A1 | 7/2006 | Carlson et al. | |
| 2006/0169668 A1 | 8/2006 | Samoilov | |
| 2006/0169669 A1 | 8/2006 | Zojaji et al. | |
| 2006/0205194 A1 | 9/2006 | Bauer | |
| 2006/0234504 A1 | 10/2006 | Bauer et al. | |
| 2006/0240630 A1 | 10/2006 | Bauer et al. | |
| 2006/0289900 A1 | 12/2006 | Thirupapuliyur et al. | |
| 2007/0161316 A1 | 7/2007 | Taguchi et al. | |
| 2007/0287272 A1 | 12/2007 | Bauer et al. | |
| 2008/0026149 A1 | 1/2008 | Tomasini et al. | |

FOREIGN PATENT DOCUMENTS

| | | |
|---|---|---|
| WO | WO 96/17107 | 6/1996 |
| WO | WO 99/41423 | 8/1999 |
| WO | WO 99/62109 | 12/1999 |
| WO | WO 00/11721 | 3/2000 |
| WO | WO 00/13207 | 3/2000 |
| WO | WO 00/15866 | 3/2000 |
| WO | WO 00/15881 | 3/2000 |
| WO | WO 00/16377 | 3/2000 |
| WO | WO 00/22659 | 4/2000 |
| WO | WO 00/55895 | 9/2000 |
| WO | WO 00/75964 | 12/2000 |
| WO | WO 00/79576 | 12/2000 |
| WO | WO 01/15220 | 3/2001 |
| WO | WO 01/36702 | 5/2001 |
| WO | WO 01/45149 | 6/2001 |
| WO | WO 01/66832 | 9/2001 |
| WO | WO 01/78123 | 10/2001 |
| WO | WO 01/78124 | 10/2001 |
| WO | WO 01/99166 | 12/2001 |

OTHER PUBLICATIONS

Antonell et al., "Carbon incorporation for strain compensation during solid phase epitaxial recrystallization of SiGe on Si at 500-600° C.", J. Appl. Phys. 79 (10), pp. 7646-7651 (1996).

Aoyama, T., "Si Selective Epitaxial Growth Using Cl2 Pulsed Molecular Flow Method," Thin Solid Films 321 (1998) 256-260, © 1998 Elsevier Science S.A.

Bauer et al., "$Si_3H_8$ based epitaxy of biaxially stressed silicon films doped with carbon and arsenic for CMOS applications", in Semiconductor Defect Engineering—Materials, Synthetic Structures and Devices, edited by S. Ashok, J. Chevallier, B.L. Sopori, M. Tabe, and P. Kiesel (Mater. Res. Soc. Symp. Proc. 864, Warrendale, PA, 2005), E4.30.

Bauer et al., "Time resolved reflectivity measurements of silicon solid phase epitaxial regrowth", Thin Solid Films 364, pp. 228-232 (2000).

Bedair; *Selective area and sidewall growth by atomic layer epitaxy*; Semicond. Sci. Technol; 1993; 1052-1062; vol. 8.

Düscö et al.; *Deposition of Tin Oxide into Porous Silicon by Atomic Layer Epitaxy*; J. Electrochem. Soc.; Feb. 1996; pp. 683-687; vol. 143, No. 2.

Eberl et al., "Structural properties of SiC and SiGeC alloy layers on Si", Chapter 2.5 in "Properties of Silicon Germanium and SiGe:Carbon", Institution of Electrical Engineers, pp. 75-77 (1999).

Fazan et al.; *A High-C Capacitor (20.4 Ff/μm2) with Ultrathin CVD—Ta2O5 Films Deposited on Rugged Poly-Si for High Density DRAMs*; IEEE; 1992; pp. IDEM 92-263-IDEM 92-266.

Feng et al., "Raman determination of layer stresses and strains for heterostructures and its application to the cubic SiC/Si system", J. Appl. Phys. 64 (12), pp. 6827-6835 (1988).

George et al.; *Nucleation and Growth During Tungsten Atomic Layer Deposition on Oxide Surfaces*; Mat. Res. Symp. Proc. vol. 672; Materials Research Society 2001; 07.7.1-07.7.7.

Haukka et al.; *Chemisorption of chromium acetylacetonate on porous high surface area silica*; Applied Surface Science; 1994; pp. 220-227.

Hiltunen et al.; *Nitrides of Titanium, Niobium, Tantalum and Molybdenum Grown as Thin Films by the Atomic Layer Epitaxy Method*; Thin Solid Films; 1988; pp. 149-154; vol. 166.

Horiike et al.; *Filling of Si Oxide into a Deep Trench using Digital CVD Method*; Applied Surface Science; 1990; pp. 168-174; vol. 46.

Hoyt, "Substitutional carbon incorporation and electronic characterization of $Si_{1-y}C_y/Si$ and $Si_{1-x-y}Ge_xC_y/Si$ heterojunctions", Chapter 3 in "Silicon-Germanium Carbon Alloy", Taylor and Francis (New York, NY), pp. 59-89 (2002).

Jin et al.; *Porous Silica Xerogel Processing and Integration for ULSI Applications*; Materials Research Society Symposium Proceedings; 1998; pp. 213-222; vol. 511.

Jorke, "Segregation of Ge and dopant atoms during growth of SiGe layers", Chapter 6.3 in "Properties of Silicon Germanium and SiGe:Carbon", Institution of Electrical Engineers, pp. 287-301 (1999).

Juppo et al.; *Deposition of copper films by an alternate supply of CuCl and Zn*; J. Vac. Sci. Technol.; 1997; pp. 2003; Vol.-issue A 15(4).

Kaizuka et al.; *Conformal Chemical Vapor Deposition TiN(111) Film Formation as an Underlayer of Al for Highly Reliable Interconnects*; Jpn. J. Appl. Phys.; 1994; pp. 470-474; vol. 33.

Kikkawa et al.; *A Quarter-Micrometer Interconnection Technology Using a TiN/Al-Si-Cu/TiN/Al-Si-Cu/TiN/Ti Multilayer Structure*; IEEE Transactions on Electron Devices; Feb. 1993; pp. 296-302; vol. 40, No. 2.

Kikkawa et al.; *Al-Si-Cu/TiN multilayer interconnection and Al-Ge reflow sputtering technologies for quarter-micron devices*; SPIE; 1992; pp. 54-64; vol. 1805.

Kim et al.; *Applicability of ALE Tin films as Cu/Si diffusion barriers*; Thin Solid Films; 2000; pp. 276-283; 372(1).

Kim et al.; *Comparison of TiN and TiAlN as a Diffusion Barrier Deposited by Atomic Layer Deposition*; Journal of the Korean Physical Society; 2002; pp. 176-179; 40(1).

Klaus et al.; *Atomic Layer Deposition of SiO2 Using Catalyzed and Uncatalyzed Self-Limiting Surface Reactions*; Surface Review and Letters; 1999; pp. 435-448; vol. 6, Nos. 3 & 4.

Klaus et al.; *Atomic Layer Deposition of Tungsten Nitride Films Using Sequential Surface Reactions*; J. Electrochem Soc.; 2000; 1175-1181; 147(3).

Klaus et al.; *Atomically controlled growth of tungsten and tungsten nitride using sequential surface reactions*; Applied Surface Science; 2000; pp. 479-491; vols. 162-163.

Koo et al.; *Study on the characteristics of TiAlN thin film deposited by atomic layer deposition method*; Journal of Vacuum Science & Technology, A: Vacuum Surfaces, and Films; 2001; 2931-2834; 19(6).

Kouvetakis et al., "Synthesis and analysis of compounds and alloys in the GeC, SiC, and SiGeC systems", Chapter 2 in Series—Optoelectronic properties of semiconductors and superlattices; v. 15 Silicon-germanium carbon alloy / edited by S.T. Pantelides and S. Zollner; pp. 19-58.

Kukli et al.; *Atomic Layer Epitaxy Growth of Tantalum Oxide Thin Films from Ta(OC2H5)5 and H2O*; J. Electrochem. Soc.; May 1995; pp. 1670-1674; vol. 142, No. 5.

Leskelä et al.; *Atomic Layer Epitaxy in Deposition of Various Oxide and Nitride Thin Films*; Journal De Physique IV, Colloque C5, supplement au Journal de Physique II; Jun. 1995; pp. C5-937-C5-951; vol. 5.

Macknight et al., "RTP applications and technology options for the sub-45 nm node", Proceedings, RTP2004 Conference (Portland, OR) (2004).

Martensson et al.; *Atomic layer epitaxy of copper an ab inition investigation of the CuCl/H2 process III. Reaction barriers*; Appl. Surf. Sc.; 2000; 92-100; 157(1).

Martensson et al.; *Atomic Layer Epitaxy of Copper on Tantalum*; Chemical Vapor Deposition; 1997; pp. 45-50; vol. 3, No. 1.

Martensson et al.; *Atomic Layer Epitaxy of Copper, Growth and Selectivity in the Cu(II)-2,2,6, 6-tetramethyl-3,5-heptanedionate/H2 Process*; J. Electrochem. Soc.; Aug. 1998; pp. 2926-2931; vol. 145, No. 8.

Martensson et al.; *CU(THD)2 as Copper Source in Atomic Layer Epitaxy*; Proc. Electrochem. Soc.; 1997; 1529-1536; 97-25.

Martensson et al.; *Use of Atomic Layer Epitaxy for Fabrication of Si/TiN/Cu Structures*; J. Vac. Sci. Technol. B, Sep./Oct. 1999; pp. 2122-2128; vol. 17, No. 5.

Meléndez-Lira et al., "Substitutional carbon in $Si_{1-y}C_y$ alloys as measured with infrared absorption and Raman spectroscopy", J. Appl. Phys. 82, pp. 4246-4252 (1997).

Min et al.; *Atomic Layer Deposition of TiN Films by Alternate Supply of Tetrakis (ethylmethylamino)-Titanium and Ammonia*; Japanese Journal of Applied Physics; 1998; pp. 4999-5004; vol. 37.

Min et al.; *Chemical Vapor Deposition of Ti-Si-N Films with Alternating Source Supply*; Mat. Res. Soc. Symp. Proc.; 1999; pp. 207-210; vol. 564; Materials Research Society.

Min et al.; *Metal-Organic Atomic-Layer Deposition of Titanium-Silicon-Nitride Films*; Applied Physics Letters; 1999; pp. 1521-1523; vol. 75, No. 11.

Min; *Atomic Layer Deposition of TiN Thin Films by Sequential Introduction of Ti Precursor and NH3*; Materials Research Society Symposium Proceedings; 1998; pp. 337-343; vol. 514.

Moller; *Copper and Nickel Ultrathin Films on Metal-Oxide Crystal Surfaces* Mater. Soc. Monogr.; 1994; 473-522; 81.

Niinistö et al.; *Synthesis of oxide thin films and overlayers by atomic layer epitaxy for advanced applications*; Materials Science and Engineering; 1996; pp. 23-29; vol. B41.

Oehme et al., "A novel measurement method of segregating adlayers in MBE", Thin Solid Films 369, pp. 138-142 (2000).

Oehme et al., "Carbon segregation in silicon", Thin Solid Films 380, pp. 75-77 (2000).

O'Neil et al., "Optimization of process conditions for selective silicon epitaxy using disilane, hydrogen, and chlorine", J. Electrochem. Soc. 144 (9), pp. 3309-3315 (1997).

Osten et al., "Substitutional carbon incorporation in epitaxial $Si_{1-y}C_y$ alloys on Si(001) grown by molecular beam epitaxy", Applied Physics Letters 74 (6), pp. 836-838 (1999).

Osten et al., "Substitutional versus interstitial carbon incorporation during psuedomorphic growth of $Si_{1-y}C_y$ on Si(001)", J. Appl. Phys. 80 (12), pp. 6711-6715 (1996).

Ott et al.; *Modification of Porous Alumina membranes Using Al2O3 Atomic Layer Controlled Deposition*; Chem. Mater.; 1997; pp. 707-714; vol. 9.

PCT Search Report, PCT Application PCT/US2006/003333; Jun. 30, 2006.

PCT Search Report, PCT Application PCT/US2006/003465; Jul. 7, 2006.

Ritala et al.; *Atomic Layer Epitaxy Growth of TiN Thin Films from TiIa and NH3*; J. Electrochem. Soc.; Aug. 1998; pp. 2914-2920; vol. 145; No. 8.

Ritala et al.; *Controlled Growth of TaN, Ta3N5, and TaOxNy Thin Filims by Atomic Layer Deposition*; Chem. Mater.; 1999; pp. 1712-1718; vol. 11.

Ritala et al.; *Effects of intermediate zinc pulses on properties of TiN and NbN films deposited by atomic layer epitaxy*; Appl. Surf. Sci.; 1997; 199-212; 120.

Ritala et al.; *Perfectly Conformal TiN and Al2O3 Films Deposited by Atomic Layer Deposition*; Chem Vap. Deposition; 1999; pp. 7-9; vol. 5, No. 1.

Rossnagel et al.; *Plasma-enhanced atomic layer deposition of Ta and Ti for interconnect diffusin barriers*; J. Vac. Sci. Technol.; 2000; 2016-2020; 18(4).

Ryan et al.; *Material Property Characterization and Integration Issues for Mesoporous Silica*; IEEE, 1999; pp. IITC 99-187-IITC 99-189.

Sakaue et al.; *Digital Chemical Vapor Deposition of SiO2 Using a Repetitive Reaction of Triethylsilane/Hydrogen and Oxidation*; Japanese Journal of Applied Physics; Jan. 1990; pp. L124-L127; vol. 30, No. 1B.

Singer; *Atomic Layer Deposition Targets Thin Films*; Semiconductor International; Sep. 1999; pp. 40.

Sneh et al.; *Atomic layer growth of SiO2 on Si(100) using SiCl4 and H2O in a binary reaction sequence*; Surface Science; 1995; pp. 135-152; vol. 334.

Solanki et al.; *Atomic Layer Deposition of Copper Seed Layers*; Electrochem. and Solid State Lett.; 2000; 479-480; 3(10).

Strane et al., "Carbon incorporation into Si at high concentrations by ion implantation and solid phase epitaxy", J. Appl. Phys. 79 (2), pp. 637-646 (1996).

Strane et al., "Precipitation and relaxation in strained $Si_{1-y}C_y$/Si heterostructures", J. Appl. Phys. 76 (6), pp. 3656-3668 (1994).

Tiitta et al.; *Preparation and Characterization of Phosphorus-Doped Aluminum Oxide Thin Films*; Materials Research Bulletin; 1998; pp. 1315-1323; vol. 33, No. 9.

U.S. Department of Commerce National Technical Information Service; *Ceramic Coatings on Metals Using Atomic Layer Controlled Chemical Vapor Deposition* (Assert-96); Feb. 16, 2000; Colorado University at Boulder.

Utriainen et al.; *Studies of metallic thin film growth in an atomic layer epitaxy reactor using M(ACAC)2 (M=Ni,Cu,Pt) precursors*; Appl. Surf. Sci.; 2000; 151-158; 157(3).

Van Zant, "Microchip Fabrication", 4th Ed., McGraw Hill (New York, NY), pp. 364-365 (2000).

Violette et al., "On the role of chlorine in selective silicon epitaxy by chemical vapor deposition", J. Electrochem. Soc. 143 (10), pp. 3290-3296 (1996).

Wang; *Spin on Dielectric Films—A General Overview*; 1998 5th International Conference on Solid-State and Integrated Circuit Technology Proceedings; Oct. 21-23, 1998; p. 961; Beijing, China.

Windl et al., "Theory of strain and electronic structure of $Si_{1-y}C_y$ and $Si_{1-x-y}Ge_xC_y$ alloys", Phys. Rev. B57 (4), pp. 2431-2442 (1998).

Wise et al.; *Diethyldiethoxysilane as a New Precursor for SiO2 Growth on Silicon*; Mat. Res. Soc. Symp. Proc.; 1994; pp. 37-43; vol. 334.

Wolf et al.; *Process and Equipment Simulation of Copper Chemical Vapor Deposition Using Cu(hfac)vtms*; Microelectronic Engineering; 1999; 15-27; 45.

Yagi et al.; *Substitutional C incorporation into Si1—yCy alloys using novel carbon source, 1,3-disilabutane*; Japanese Journal of Applied Physics; 2004; pp. 4153-4154; vol. 43, No. 7A.

Zhang et al., "Selective epitaxial growth using dichlorosilane and silane by low pressure chemical vapor deposition," Microelectric Engineering 73-74, pp. 514-518 (2004).

\* cited by examiner

METHODS OF MAKING SUBSTITUTIONALLY CARBON-DOPED CRYSTALLINE SI-CONTAINING MATERIALS BY CHEMICAL VAPOR DEPOSITION

CROSS-REFERENCE TO RELATED APPLICATIONS

This application is a divisional of U.S. Non-Provisional Application No. 11/343,275, filed Jan. 30, 2006 now U.S. Pat. No. 7,438,760, which claims priority to U.S. Provisional Application No. 60/649,990, filed Feb. 4, 2005; U.S. Provisional Application No. 60/663,434, filed Mar. 18, 2005; and U.S. Provisional Application No. 60/668,420, filed Apr. 4, 2005; all of which are hereby incorporated by reference in their entireties.

This application is related to, and incorporates by reference in their entireties, the following U.S. patent applications: U.S. patent application Ser. No. 11/343,264, entitled "SELECTIVE DEPOSITION OF SILICON-CONTAINING FILMS"; and U.S. patent application Ser. No. 11/343,244, entitled "METHODS OF MAKING ELECTRICALLY DOPED CRYSTALLINE SI-CONTAINING FILMS, both of which are filed on even date with the parent application.

BACKGROUND OF THE INVENTION

1. Field of the Invention

This application relates generally to the deposition of silicon-containing materials in semiconductor processing. More particularly, this application relates to the deposition of substitutionally-doped silicon-containing films by chemical vapor deposition using trisilane and a dopant source.

2. Description of the Related Art

The electrical properties of semiconductors such as silicon (Si), germanium (Ge) and alloys thereof (SiGe) are influenced by the degree to which the materials are strained. For example, silicon exhibits enhanced electron mobility under tensile strain, and silicon-germanium (SiGe) exhibits enhanced hole mobility under compressive strain. Methods of enhancing the performance of semiconductors are of considerable interest and have potential applications in a variety of semiconductor processing applications. As is well known, semiconductor processing is most commonly employed for the fabrication of integrated circuits, which entails particularly stringent quality demands, but such processing is also employed in a variety of other fields. For example, semiconductor processing techniques are often employed in the fabrication of flat panel displays using a wide variety of technologies and in the fabrication of microelectromechanical systems (MEMS).

A number of approaches for inducing strain in Si- and Ge-containing materials have focused on exploiting the differences in the lattice constants between various crystalline materials, e.g., Ge (5.65 Å), Si (5.431 Å) and carbon (3.567 Å for diamond). In one approach, thin layers of a particular crystalline material are deposited onto a different crystalline material in such a way that the deposited layer adopts the lattice constant of the underlying single crystal material. For example, strained SiGe layers may be formed by heteroepitaxial deposition onto single crystal Si substrates. Because the Ge atoms are slightly larger than the Si atoms, the deposited heteroepitaxial SiGe follows the smaller lattice constant of the Si beneath it and thus is compressively strained to a degree that varies as a function of the Ge content. Typically, the band gap decreases monotonically from 1.12 eV for pure Si to 0.67 eV for pure Ge as the Ge content in the SiGe increases. In another approach, tensile strain is introduced into a thin single crystalline silicon layer by heteroepitaxially depositing the silicon layer onto a strain-relaxed SiGe layer. In this example, the heteroepitaxially deposited silicon is strained because its lattice constant follows the larger lattice constant of the relaxed SiGe beneath it. The tensile strained heteroepitaxially deposited silicon typically exhibits increased electron mobility. In these approaches, the strain is developed at the substrate level before the device (e.g., a transistor) is fabricated.

Strain may be introduced into single crystalline Si-containing materials by substitutional doping, e.g., where the dopants replace Si in the lattice structure. For example, substitution of germanium atoms for some of the silicon atoms in the lattice structure of single crystalline silicon produces a compressive strain in the resulting substitutionally doped single crystalline silicon material because the germanium atoms are larger than the silicon atoms that they replace. A tensile strain may be introduced into single crystalline silicon by substitutional doping with carbon, because carbon atoms are smaller than the silicon atoms that they replace. See, e.g., Judy L. Hoyt, "Substitutional Carbon Incorporation and Electronic Characterization of $Si_{1-y}C_y$/Si and $Si_{1-x-y}Ge_xC_y$/Si Heterojunctions," Chapter 3 in "Silicon-Germanium Carbon Alloy," Taylor and Francis, NY, pp. 59-89, 2002, the disclosure of which is incorporated herein by reference.

In situ doping is often preferred over ex situ doping followed by annealing to incorporate the dopant into the lattice structure because the annealing may undesirably consume thermal budget. However, in practice in situ substitutional carbon doping is complicated by the tendency for the dopant to incorporate non-substitutionally during deposition, e.g., interstitially in domains or clusters within the silicon, rather than by substituting for silicon atoms in the lattice structure. See, e.g., the aforementioned article by Hoyt. Non-substitutional doping also complicates substitutional doping using other material systems, e.g., carbon doping of SiGe, doping of Si and SiGe with electrically active dopants, etc. As illustrated in FIG. 3.10 at page 73 of the aforementioned article by Hoyt, prior deposition methods have been used to make crystalline silicon having an in situ doped substitutional carbon content of up to 2.3 atomic %, which corresponds to a lattice spacing of over 5.4 Å and a tensile stress of less than 1.0 GPa. However, prior deposition methods are not known to have been successful for depositing single crystal silicon having an in situ doped substitutional carbon content of greater than 2.3 atomic %.

Thus, there is a need for improved methods to accomplish in situ substitutional doping of Si-containing materials. Desirably, such improved methods would be capable of achieving commercially significant levels of substitutional doping without unduly sacrificing deposition speed, selectivity, and/or the quality (e.g., crystal quality) of the deposited materials.

SUMMARY OF THE INVENTION

Deposition methods have now been developed that utilize a silicon source and a carbon source to deposit carbon-doped Si-containing films. Such deposition methods are capable of producing a variety of Si-containing single crystal films that are substitutionally doped with carbon to various levels, including levels that are significantly higher than those achieved using prior methods. For example, preferred deposition methods using trisilane as a silicon source can be used to deposit a variety of carbon-doped single crystal Si films having a range of substitutional carbon levels, including levels of greater than 2.3 atomic %. Other carbon-doped single crystal films, such as phosphorous- and arsenic-doped Si:C, may also be deposited by the methods described herein.

An embodiment provides a doped single crystalline silicon film comprising substitutional carbon, the single crystalline silicon film having a lattice spacing of 5.38 Å or less.

Another embodiment provides a single crystalline silicon film comprising 2.4 atomic % or greater substitutional carbon, as determined by x-ray diffraction and Vegard's Law. In preferred embodiments, the single crystalline silicon film comprises less than about 0.25 atomic % non-substitutional carbon, more preferably less than about 0.15 atomic % non-substitutional carbon.

Another embodiment provides a method for depositing a single crystalline silicon film, comprising:
providing a substrate disposed within a chamber;
introducing trisilane and a carbon source to the chamber under chemical vapor deposition conditions; and
depositing a single crystalline silicon film onto the substrate at a deposition rate of at least about 5 nanometers (nm) per minute, the single crystalline silicon film comprising at least 1.0 atomic % substitutional carbon, as determined by x-ray diffraction and Vegard's Law.

Another embodiment provides an integrated circuit comprising a first single crystalline Si-containing region and a second single crystalline Si-containing region, at least one of the first single crystalline Si-containing region and the second single crystalline Si-containing region comprising an amount of substitutional carbon effective to exert a tensile stress on a third single crystalline Si-containing region positioned between the first single crystalline Si-containing region and the second single crystalline Si-containing region, the third single crystalline Si-containing region exhibiting an increase in carrier mobility of at least about 10% as compared to a comparable unstressed region.

These and other embodiments are described in greater detail below.

DETAILED DESCRIPTION OF THE PREFERRED EMBODIMENTS

Figure 1B:
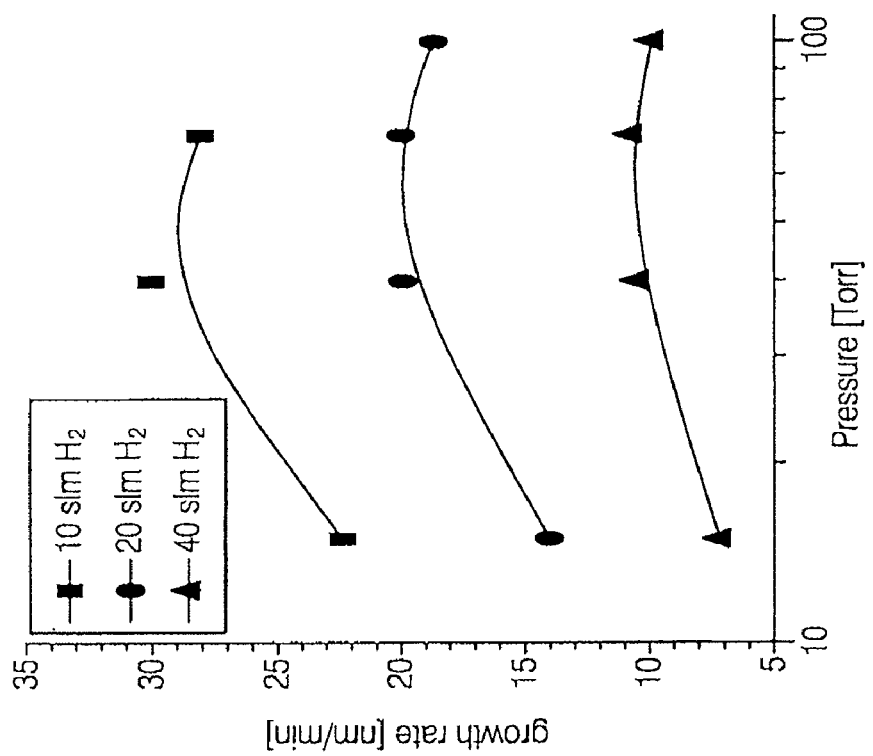
FIG. 1B shows a graph of growth rate as a function of deposition pressure for three different carrier gas ($H_2$) flow rates.

Deposition methods have now been developed that are useful for making a variety of substitutionally doped single crystalline Si-containing materials. For example, it has been found that crystalline Si may be in situ doped to contain relatively high levels of substitutional carbon by carrying out the deposition at a relatively high rate using trisilane as a silicon source and a carbon-containing gas as a carbon source. In preferred embodiments, the resulting carbon-doped Si-containing material is substitutionally doped to a significant degree. For example, the degree of substitutional carbon doping may be about 70% or greater, preferably about 80% or greater, more preferably about 90% or greater, expressed as the weight percentage of substitutional carbon dopant based on total amount of carbon dopant (substitutional and non-substitutional) in the silicon. The deposition of carbon-doped layers in accordance with this aspect can be conducted with or without an etchant gas, selectively or non-selectively, as described in greater detail below.

The term "Si-containing material" and similar terms are used herein to refer to a broad variety of silicon-containing materials including without limitation Si (including crystalline silicon), Si:C (e.g., carbon-doped crystalline Si), SiGe and SiGeC (e.g., carbon-doped crystalline SiGe). As used herein, "carbon-doped Si", "Si:C", "SiGe", "carbon-doped SiGe", "SiGe:C" and similar terms refer to materials that contain the indicated chemical elements in various proportions and, optionally, minor amounts of other elements. For example, "SiGe" is a material that comprises silicon, germanium and, optionally, other elements, e.g., dopants such as carbon and electrically active dopants. Thus, carbon-doped Si may be referred to herein as Si:C or vice versa. Terms such as "Si:C", "SiGe", and "SiGe:C" are not stoichiometric chemical formulas per se and thus are not limited to materials that contain particular ratios of the indicated elements. The percentage of a dopant (such as carbon, germanium or electrically active dopant) in a Si-containing film is expressed herein in atomic percent on a whole film basis, unless otherwise stated.

The amount of carbon substitutionally doped into a Si-containing material may be determined by measuring the perpendicular lattice spacing of the doped Si-containing material by x-ray diffraction, then applying Vegard's law (linear interpolation between single crystal Si and single crystal carbon) in a manner known to those skilled in the art. For example, the amount of carbon substitutionally doped into Si may be determined by measuring the perpendicular lattice spacing of the doped Si by x-ray diffraction, then applying Vegard's law. Those skilled in the art are aware of Vegard's law and the relationships between substitutional carbon level, lattice spacing and strain. See, e.g., Judy L. Hoyt, "Substitutional Carbon Incorporation and Electronic Characterization of $Si_{1-y}C_y/Si$ and $Si_{1-x-y}Ge_xC_y/Si$ Heterojunctions," Chapter 3 in "Silicon-Germanium Carbon Alloy," Taylor and Francis, NY, pp. 59-89, 2002. As illustrated in FIG. 3.10 at page 73 of the aforementioned article by Hoyt, the total carbon content in the doped silicon may be determined by SIMS, and the non-substitutional carbon content may be determined by subtracting the substitutional carbon content from the total carbon content. The amount of other elements substitutionally doped into other Si-containing materials may be determined in a similar manner.

Various embodiments provide methods for depositing carbon-doped Si-containing materials (such as carbon-doped single crystalline Si) using a silicon source that comprises trisilane, a carbon source and, optionally, source(s) of other elements such as electrical active dopant(s). Under the CVD conditions taught herein, the delivery of trisilane and a carbon source to the surface of a substrate preferably results in the formation of an epitaxial carbon-doped Si-containing film on the surface of the substrate. In certain selective deposition embodiments described in greater detail below, an etchant gas such as chlorine gas ($Cl_2$) is delivered to the substrate in conjunction with the trisilane and carbon source, and the Si-containing film is deposited selectively over single crystal substrates or single crystal regions of mixed substrates. Methods employing relatively high deposition rates are preferred, and in preferred embodiments such methods have been found to result in the deposition of in situ doped crystalline Si-containing materials containing relatively high levels of substitutional carbon.

"Substrate," as that term is used herein, refers either to the workpiece upon which deposition is desired, or the surface exposed to the deposition gas(es). For example, the substrate may be a single crystal silicon wafer, or may be a semiconductor-on-insulator (SOI) substrate, or may be an epitaxial Si, SiGe or Ill-V material deposited upon such wafers. Workpieces are not limited to wafers, but also include glass, plastic, or any other substrate employed in semiconductor processing. The term "mixed substrate" is known to those skilled in the art, see U.S. Pat. No. 6,900,115 (issued May 31, 2005), entitled "Deposition Over Mixed Substrates," which is hereby incorporated herein by reference in its entirety and particularly for the purpose of describing mixed substrates.

As discussed in U.S. Pat. No. 6,900,115, a mixed substrate is a substrate that has two or more different types of surfaces. For example, a mixed substrate may comprise a first surface having a first surface morphology and a second surface having a second surface morphology. In certain embodiments, carbon-doped Si-containing layers are selectively formed over single crystal semiconductor materials while minimizing and more preferably avoiding deposition over adjacent dielectrics. Examples of dielectric materials include silicon dioxide (including low dielectric constant forms such as carbon-doped and fluorine-doped oxides of silicon), silicon nitride, metal oxide and metal silicate. The terms "epitaxial", "epitaxially" "heteroepitaxial", "heteroepitaxially" and similar terms are used herein to refer to the deposition of a crystalline Si-containing material onto a crystalline substrate in such a way that the deposited layer adopts or follows the lattice constant of the substrate. Epitaxial deposition may be heteroepitaxial when the composition of the deposited layer is different from that of the substrate.

Even if the materials are made from the same element, the surfaces can be different if the morphologies (crystallinity) of the surfaces are different. The processes described herein are useful for depositing Si-containing films on a variety of substrates, but are particularly useful for mixed substrates having mixed surface morphologies. Such a mixed substrate comprises a first surface having a first surface morphology and a second surface having a second surface morphology. In this context, "surface morphology" refers to the crystalline structure of the substrate surface. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by a crystal structure and orientation that is identical to the substrate upon which they are grown, typically single crystal. The atoms in these materials are arranged in a lattice-like structure that persists over relatively long distances (on an atomic scale). Amorphous morphology is a non-crystalline structure having a low degree of order because the atoms lack a definite periodic arrangement. Other morphologies include microcrystalline and mixtures of amorphous and crystalline material. As used herein, "single-crystal" or "epitaxial" is used to describe a predominantly large crystal structure that may have a tolerable number of faults therein, as is commonly employed for transistor fabrication. The skilled artisan will appreciate that crystallinity of a layer generally falls along a continuum from amorphous to polycrystalline to single-crystal; the skilled artisan can readily determine when a crystal structure can be considered single-crystal or epitaxial, despite low density faults. Specific examples of mixed substrates include without limitation single crystal/polycrystalline, single crystal/amorphous, epitaxial/polycrystalline, epitaxial/amorphous, single crystal/dielectric, epitaxial/dielectric, conductor/dielectric, and semiconductor/dielectric. The term "mixed substrate" includes substrates having more than two different types of surfaces, and thus the skilled artisan will understand that methods described herein for depositing Si-containing films onto mixed substrates having two types of surfaces may also be applied to mixed substrates having three or more different types of surfaces.

Carbon-doped Si-containing Films and Methods

An embodiment provides a method for depositing a single crystalline silicon film, comprising: providing a substrate disposed within a CVD reactor; introducing trisilane and a carbon source to the reactor under chemical vapor deposition conditions; and depositing a single crystalline silicon film onto the substrate. The deposition is preferably carried out at a deposition rate of at least about 5 nm per minute, more preferably at least about 10 nm per minute, even more preferably at least about 20 nm per minute. Preferably, the resulting single crystalline silicon film comprises at least about 1.0 atomic % substitutional carbon, more preferably about 1.5 atomic % or greater substitutional carbon, even more preferably 2.4 atomic % or greater substitutional carbon, as determined by x-ray diffraction and Vegard's Law.

Deposition may be suitably conducted according to the various CVD methods known to those skilled in the art, but the greatest benefits are obtained when deposition is conducted according to the CVD methods taught herein. The disclosed methods may be suitably practiced by employing CVD, including plasma-enhanced chemical vapor deposition (PECVD) or thermal CVD, utilizing trisilane vapor and a carbon source to deposit a single crystalline Si-containing film onto a substrate within a CVD chamber. In some embodiments, the Si-containing film is a carbon-doped epitaxial Si film. In some embodiments, a gaseous chlorine-containing etchant (such as HCl or, more preferably, chlorine) is introduced to the chamber in conjunction with the trisilane and carbon source to thereby selectively deposit a single crystalline Si-containing film. In the following description, reference may be made to the use of trisilane and a carbon source to deposit a Si or Si-containing film. It will be recognized that those descriptions are also generally applicable to the deposition of other Si-containing films, e.g., the deposition of SiGe:C films (e.g., involving the use of a germanium source), to the deposition of electrically doped Si:C and SiGe:C films (e.g., involving the use of a dopant precursor for an electrical dopant) and to selective depositions (e.g., involving the use of an etchant source), unless otherwise stated. Thermal CVD is preferred, as deposition can be achieved effectively without the risk of damage to substrates and equipment that attends plasma processing.

Trisilane and the carbon source (and, optionally, an etchant gas and/or an electrical dopant precursor, in certain embodiments) are preferably introduced to the chamber in the form of separate gases or by intermixing to form a feed gas. The intermixing to form the feed gas may take place in the chamber or prior to introduction of the feed gas to the chamber. The total pressure in the CVD chamber is preferably in the range of about 0.001 Torr to about 1000 Torr, more preferably in the range of about 0.1 Torr to about 350 Torr, most preferably in the range of about 0.25 Torr to about 100 Torr. Experiments were conducted with pressures ranging from 0.25 Torr to 100 Torr. In some embodiments, the chemical vapor deposition conditions comprise a chamber pressure of at least about 20 Torr, preferably a chamber pressure in the range of about 20 Torr to about 200 Torr. Chamber pressures of about at least about 500 mTorr were suitable in single wafer, single pass, laminar horizontal flow reactor in which the experiments were conducted, as described below. The chamber pressure may be referred to herein as a deposition pressure. The partial pressure of trisilane is preferably in the range of about 0.0001% to about 100% of the total pressure, more preferably about 0.001% to about 50% of the total pressure. The feed gas can also include a gas or gases other than trisilane and the carbon source, such as other silicon sources, etchant sources, dopant precursor(s) and/or inert carrier gases, but preferably trisilane is the sole source of silicon. The term "dopant precursor(s)" is used herein to refer in a general way to various materials that are precursors to various elements (e.g., carbon, germanium, boron, gallium, indium, arsenic, phosphorous, and/or antimony) that may be incorporated into the resulting deposited film in relatively minor amounts. It will be recognized that silicon sources may also be considered dopant precursors for the deposition of SiGe films that contain relatively minor amounts of silicon. Examples of suitable carrier gases for the methods described herein include He, Ar, $H_2$, and $N_2$. In certain embodiments, the carrier gas is a non-hydrogen carrier such as He, Ar and/or $N_2$ as described in greater detail below. Preferably, trisilane is introduced to the chamber by way of a vaporizer such as a bubbler used with a carrier gas to entrain trisilane vapor, more preferably by way of a delivery system comprising a bubbler and a gas concentration sensor that measures the amount of trisilane in the carrier gas flowing from the bubbler. Such sensors are commercially available, e.g., Piezocon® gas concentration sensors from Lorex Industries, Poughkeepsie, N.Y., U.S.A.

Examples of suitable carbon sources that may be included in the feed gas include without limitation silylalkanes such as monosilylmethane, disilylmethane, trisilylmethane and tetrasilylmethane, and/or alkylsilanes such as monomethyl silane (MMS), and dimethyl silane. In some embodiments, a carbon source comprises $H_3Si$—$CH_2$—$SiH_2$—$CH_3$ (1,3-disilabutane). The feed gas may also contain other materials known by those skilled in the art to be useful for doping or alloying Si-containing films, as desired, such as a supplemental silicon source, germanium source, boron source, gallium source, indium source, arsenic source, phosphorous source, and/or antimony source. Specific examples of such sources include: silane, disilane and tetrasilane as supplemental silicon sources; germane, digermane and trigermane as germanium sources; monosilylmethane, disilylmethane, trisilylmethane, tetrasilylmethane, monomethyl silane (MMS), and dimethyl silane as sources of both carbon and silicon; and various dopant precursors as sources of electrical dopants (both n-type and p-type) such as antimony, arsenic, boron, gallium, indium and phosphorous. Chlorosilylmethanes of the general formula $(SiH_{3-z}Cl_z)_xCH_{4-x-y}Cl_y$, where x is an integer in the range of 1 to 4 and where y and z are each independently zero or an integer in the range of 1 to 3, with the provisos that $x+y \leq 4$ and at least one of y and z is not zero, have been found to be particularly useful as sources of carbon, silicon and chlorine. Alkylhalosilanes of the general formula $X_aSiH_b(C_nH_{2n+1})_{4-a-b}$ are also particularly useful as sources of carbon, silicon and chlorine, where X is a halogen (e.g., F, Cl, Br); n is 1 or 2; a is 1 or 2; b is 0, 1 or 2; and the sum of a and b is less than 4. Methyldichlorosilane ($Cl_2SiH(CH_3)$) is an example of an alkylhalosilane of the formula $X_aSiH_b(C_nH_{2n+1})_{4-a-b}$.

Incorporation of electrically active dopants into Si-containing films by CVD using trisilane is preferably accomplished by in situ doping using dopant sources or dopant precursors. Preferred precursors for electrical dopants are dopant hydrides, including p-type dopant precursors such as diborane, deuterated diborane, and n-type dopant precursors such as phosphine, arsenic vapor, and arsine. Silylphosphines, e.g., $(H_3Si)_{3-x}PR_x$, and silylarsines, e.g., $(H_3Si)_{3-x}AsR_x$, where $x=0-2$ and $R_x=H$ and/or deuterium (D), are alternative precursors for phosphorous and arsenic dopants. $SbH_3$ and trimethylindium are alternative sources of antimony and indium, respectively. Such dopant precursors are useful for the preparation of preferred films as described below, preferably boron-, phosphorous-, antimony-, indium-, and arsenic-doped silicon, Si:C, SiGe and SiGeC films and alloys.

A suitable manifold may be used to supply feed gas(es) to the CVD chamber. The CVD chamber is preferably in a single wafer reactor, e.g., a single wafer, horizontal gas flow CVD chamber as described in the illustrated embodiments. Most preferably, the CVD chamber is in a single-wafer, single pass, laminar horizontal gas flow reactor, preferably radiantly heated. Suitable reactors of this type are commercially available, and preferred models include the Epsilon™ series of single wafer reactors commercially available from ASM America, Inc. of Phoenix, Ariz. While the methods described herein can also be employed in alternative reactors, such as a showerhead arrangement, benefits in increased uniformity and deposition rates have been found particularly effective in the horizontal, single-pass laminar gas flow arrangement of the Epsilon™ chambers, employing a rotating substrate, particularly with low process gas residence times. CVD may be conducted by introducing plasma products (in situ or downstream of a remote plasma generator) to the chamber, but as noted above, thermal CVD is preferred.

Figure 15:
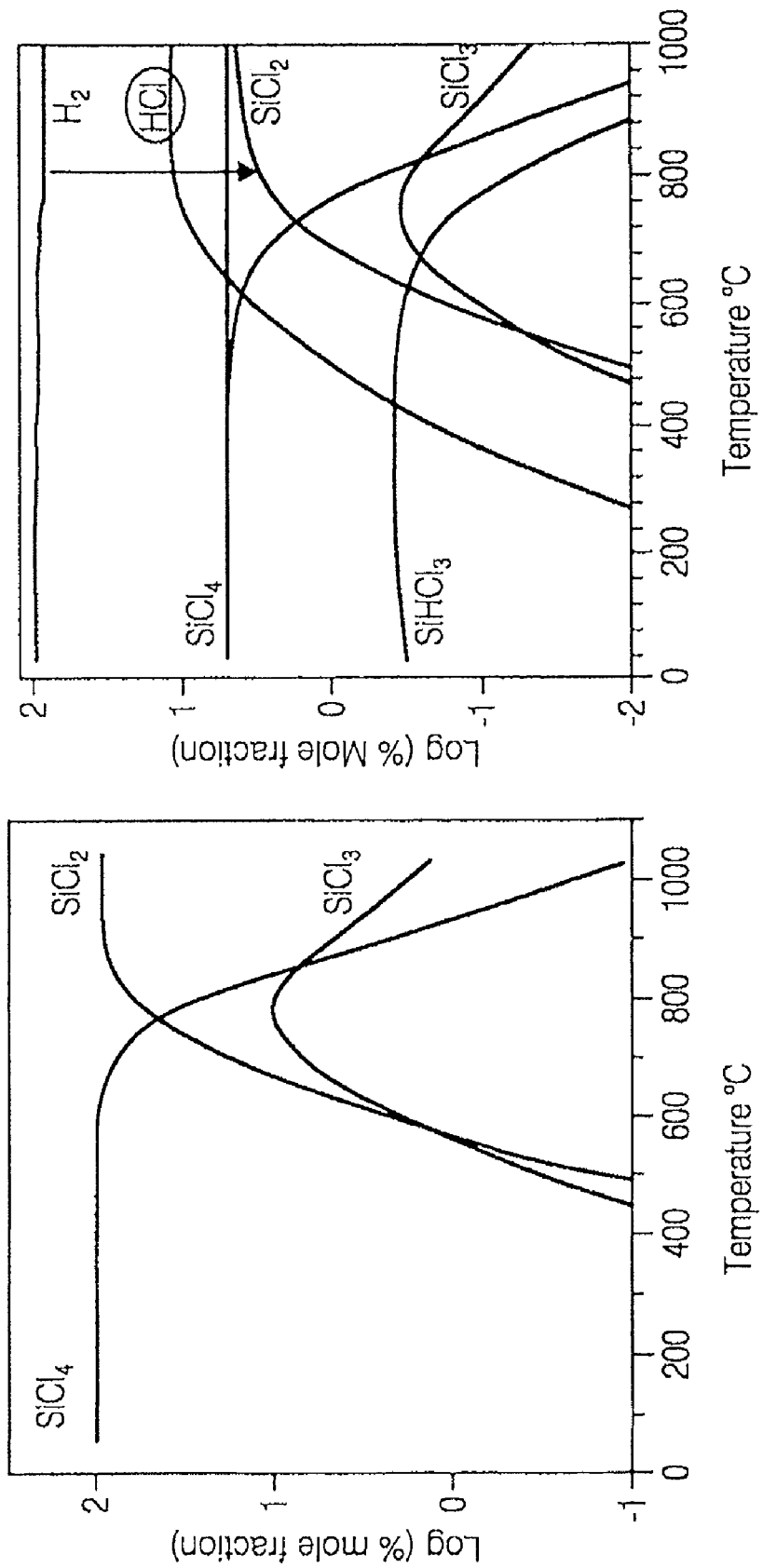
FIG. 15 shows two graphs illustrating the thermodynamic equilibria of various reactants as a function of temperature for a system including various chlorinated silicon species, with and without the addition of hydrogen carrier gas.

The amount of dopant precursor in the feed gas may be adjusted to provide the desired level of dopant in the Si-containing film. Preferred concentrations of dopant precursor in the feed gas are in the range of about 1 part per billion (ppb) to about 20% by weight based on the total weight of reactive gas (excluding inert carrier and diluent gases). For electrical dopants, preferred concentrations of dopant precursor (e.g., pure phosphine or equivalent diluted phosphine, arsine or diborane) in the feed gas are preferably between about 0.1 standard cubic centimeters per minute (sccm) to about 5 sccm, although higher or lower amounts are sometimes preferred in order to achieve the desired property in the resulting film. In the preferred Epsilon™ series of single wafer reactors, dilute mixtures of the dopant precursor in a carrier gas can be delivered to the reactor via a mass flow controller with set points ranging from about 10 sccm to about 1000 sccm, depending on desired dopant concentration and dopant gas concentration. Dilution of dopant gases can lead to factors of $10^{-7}$ to $10^{-2}$ to arrive at equivalent pure dopant flow rates. Typically commercially available dopant sources are dopant hydrides diluted in $H_2$, e.g., 1% arsine or 1% phosphine in $H_2$. However, as described below with respect to FIGS. 15-16, in some embodiments dopant precursors are diluted in a non-hydrogen inert gas. The dilute mixture is preferably further diluted by mixing with trisilane, etchant (for selective deposition embodiments), any suitable carrier gas, and the desired strain-influencing precursor for substitutional doping (e.g., for substitutional carbon doping, a carbon source such as MMS). Since typical total flow rates for deposition in the preferred Epsilon™ series reactors often range from about 20 standard liters per minute (slm) to about 180 slm, the concentration of the dopant precursor used in such a method is generally small relative to total flow.

The relative amounts of the various feed gas components may be varied over a broad range depending on the composition desired for the resulting Si-containing film and the deposition conditions employed (e.g., temperature, pressure, deposition rate, etc.), and may be determined by routine experimentation in view of the guidance provided herein. The feed gas components may be intermixed and then delivered to the chamber or substrate, or the feed gas may be formed by mixing the components at or near the substrate, e.g., by supplying the feed gas components to the CVD chamber separately.

Thermal CVD is preferably conducted at a substrate temperature that is effective to deposit a crystalline Si-containing film over the substrate. Preferably, thermal CVD is conducted at a temperature in the range of about 350° C. to about 900° C., more preferably about 500° C. to about 800° C. In an embodiment, the chemical vapor deposition conditions comprise a temperature that is at about a transition temperature between substantially mass-transport controlled deposition conditions and substantially kinetically controlled deposition conditions for trisilane. Such trisilane deposition conditions are described in U.S. Pat. No. 6,821,825, which is hereby incorporated by reference and particularly for the purpose of describing trisilane deposition conditions. PECVD is preferably conducted at a temperature in the range of about 300° C. to about 700° C. Those skilled in the art can adjust these temperature ranges to take into account the realities of actual manufacturing, e.g., preservation of thermal budget, deposition rate, different sizes of chambers, including single wafer and batch reactors, preferred total pressures and partial pressures etc. In general, higher partial pressures entail lower temperatures for a given desired result, whether it be deposition rate, layer quality or a combination of the two. The substrate can be heated by a variety of methods known in the art, e.g., resistive heating and lamp heating.

Various deposition parameters have been found to affect the incorporation of substitutional carbon into Si-containing films, including: the ratio of trisilane to other silicon sources; the ratio of carbon source flow rate to trisilane flow rate; the carrier gas flow rate; the deposition pressure; the deposition temperature; and the deposition rate. Surprisingly, it has been found that certain combinations of these parameters are particularly advantageous for achieving relatively high levels of substitutional carbon incorporation into Si-containing films. In particular, the following combinations are preferred:

A relatively high trisilane flow rate (e.g., about 100 mg/min to about 500 mg/min) in combination with at least one of the following: a relatively low flow rate for supplemental silicon sources (e.g., a relatively high ratio of trisilane flow rate to silane flow rate); a relatively low carrier gas flow rate (e.g., a relatively high ratio of trisilane flow rate to hydrogen carrier gas flow rate); a relatively high deposition rate (e.g., preferably at least about 5 nm per minute); a relatively high deposition pressure (e.g., preferably at least about one Torr, more preferably at least about 20 Torr); a relatively low deposition temperature (e.g., preferably in the range of from about 450° C. to about 650° C.); and a relatively high ratio of carbon source flow rate to trisilane flow rate (e.g., preferably a MMS to trisilane flow rate ratio of at least about 0.5 scc/mg).

A relatively high deposition pressure (e.g., about 20 Torr to about 200 Torr) in combination with at least one of the following: a relatively low carrier gas flow rate (e.g., about 1 slm to about 50 slm); a relatively high trisilane flow rate (e.g., about 100 mg/min to about 500 mg/min); a relatively high deposition rate (e.g., greater than about 5 nm/min); and a relatively low deposition temperature (e.g., preferably in the range of from about 450° C. to about 650° C.).

FIGS. 1-6 illustrate the effects of various combinations of deposition parameters. The data shown in FIGS. 1-6 was obtained for thermal chemical vapor depositions conducted in an Epsilon™ single wafer reactor (commercially available from ASM America, Inc. of Phoenix, Ariz.) using trisilane and monomethylsilane (MMS) as a carbon source to deposit a series of carbon-doped silicon films onto a single crystal silicon substrate.

Figure 1A:
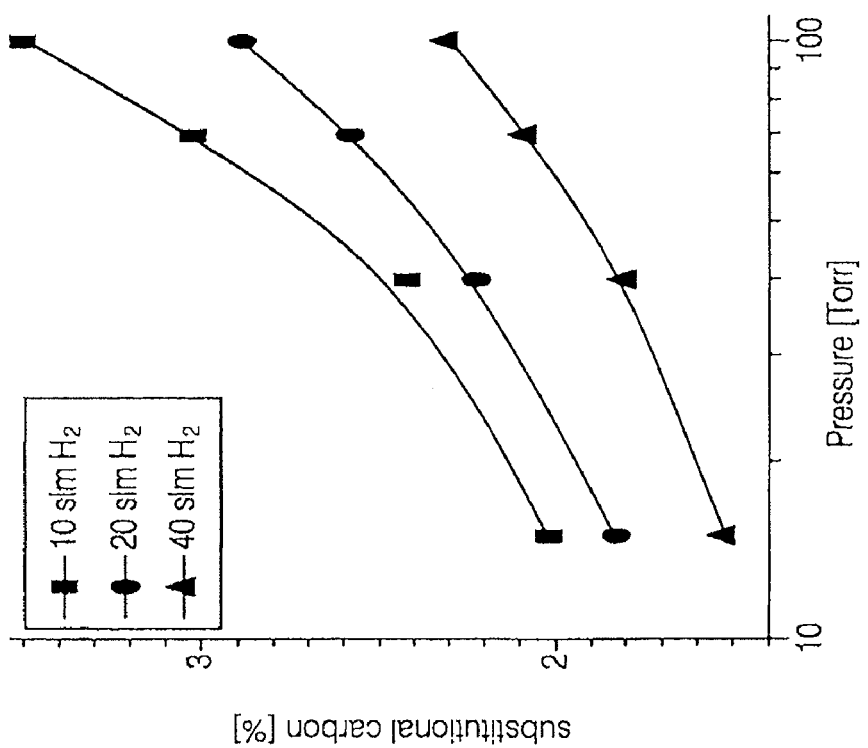
FIG. 1A shows a plot of substitutional carbon content in a silicon film as a function of deposition pressure for three different carrier gas ($H_2$) flow rates.

FIGS. 1A and 1B are plots that illustrate the effects of deposition pressure and hydrogen carrier gas flow rates (10, 20 and 40 slm) on substitutional carbon content (FIG. 1A) and growth rate (FIG. 1B) using a trisilane flow rate of 200 mg/min, a MMS flow rate of 180 sccm, and a deposition temperature of 550° C. FIG. 1A shows that increasing deposition pressure results in higher levels of substitutional carbon content at all three of the hydrogen carrier gas flow rates employed in this set of experiments. FIG. 1A also shows that, at various deposition pressures over the range of about 15 Torr to about 100 Torr, reducing hydrogen carrier gas flow rate also results in higher levels of substitutional carbon content.

FIG. 1A shows that the combination of relatively high deposition pressures and relatively low hydrogen carrier gas flow rates is particularly effective, producing a number of Si:C films that contain greater than 2.3 atomic % substitutional carbon. As noted above, FIG. 3.10 at page 73 of the aforementioned article by Hoyt shows that prior deposition methods have been used to make crystalline silicon having a substitutional carbon content of up to 2.3 atomic %, which corresponds to a lattice spacing of over 5.4 Å and a tensile stress of less than 1.0 GPa. FIG. 1A shows that the methods described herein can be used to make in situ carbon-doped crystalline silicon having a substitutional carbon content that is greater than 2.4 atomic %, a lattice spacing of 5.38 Å or less, and a tensile stress of about 1.0 GPa or greater. Thus, an embodiment provides a doped single crystalline silicon film comprising substitutional carbon, the single crystalline silicon film having a lattice spacing of 5.38 Å or less, more preferably about 5.36 Å or less, even more preferably about 5.34 Å or less. Another embodiment provides a single crystalline silicon film comprising 2.4 atomic % or greater substitutional carbon, preferably 2.7 atomic % or greater substitutional carbon, even more preferably 3.0 atomic % or greater substitutional carbon, as determined by x-ray diffraction and Vegard's Law. Another embodiment provides a carbon-doped single crystalline silicon film having a tensile stress of about 1.0 GPa or greater, preferably about 1.5 GPa or greater, more preferably about 1.7 GPa or greater, even more preferably about 1.85 GPa or greater, most preferably about 2.0 GPa or greater.

In an embodiment, each of the aforementioned carbon-doped single crystalline silicon films further comprises an electrical active dopant, e.g., a dopant selected from the group consisting of phosphorous and arsenic, that is electrically active (substitutionally incorporated) as deposited. In various embodiments, the films contain an amount of the electrically active dopant that is effective to reduce resistivity, e.g., to provide a Si:C film having a resistivity of about 1.0 mΩ·cm or less, preferably about 0.7 mΩ·cm or less. In another embodiment, each of the aforementioned single crystalline silicon films comprises less than about 0.3 atomic % non-substitutional carbon, preferably less than about 0.25 atomic % non-substitutional carbon, more preferably less than about 0.20 atomic % non-substitutional carbon, even more preferably less than about 0.15 atomic % non-substitutional carbon.

FIG. 1B shows that reducing hydrogen carrier gas flow rates results in higher growth rates. FIG. 1B also shows that increasing deposition pressure from about 15 Torr to about 100 Torr generally results in higher growth rates at all three of the hydrogen carrier gas flow rates employed in this set of experiments. Preferred carrier gas flow rates are in the range of from about 1 slm to about 50 slm, more preferably about 10 slm to about 40 slm.

Figure 2A:
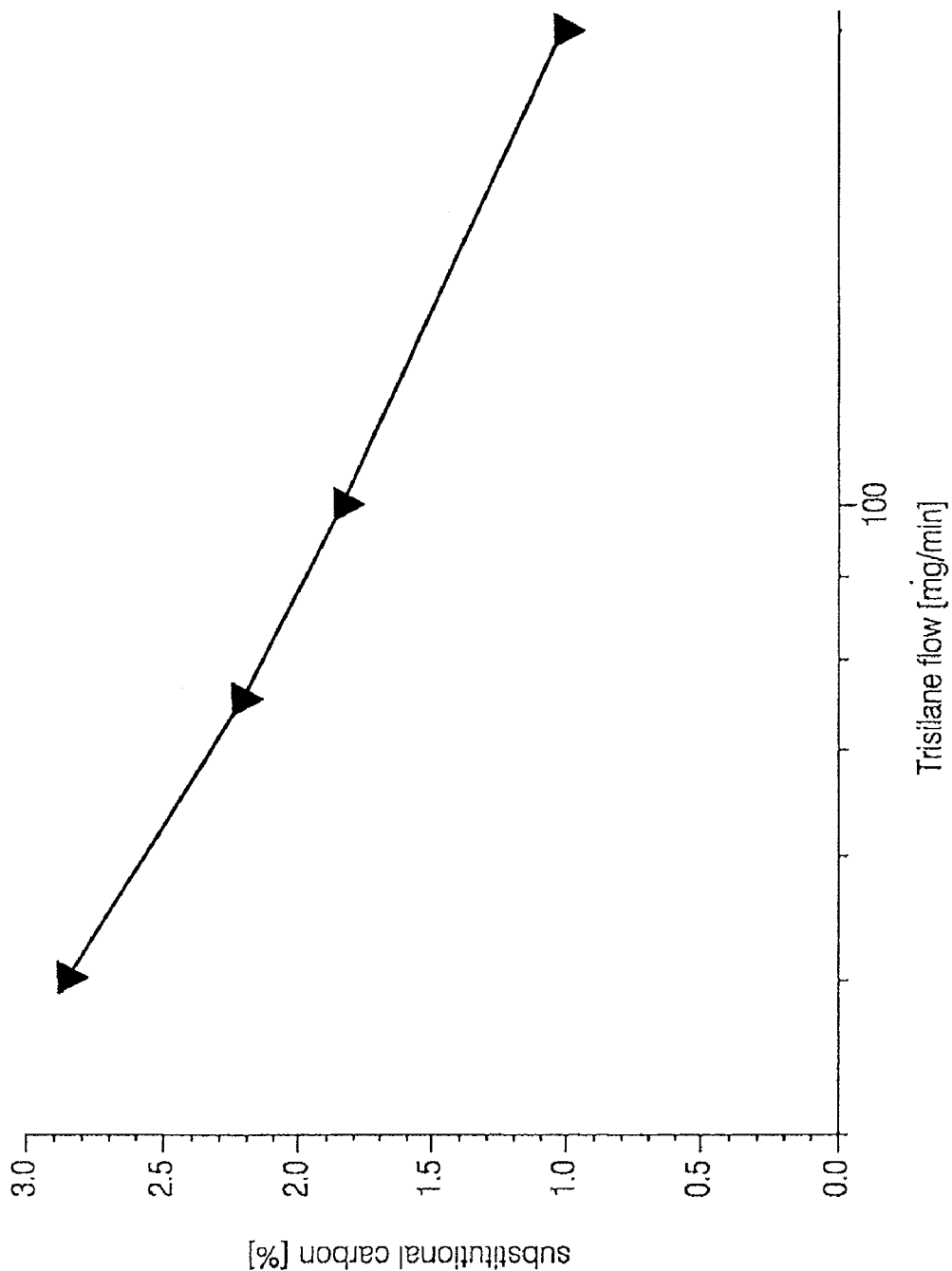
FIG. 2A shows a graph of substitutional carbon content in a silicon film as a function of trisilane flow rate, at a constant monomethylsilane (MMS) flow rate.
Figure 2B:
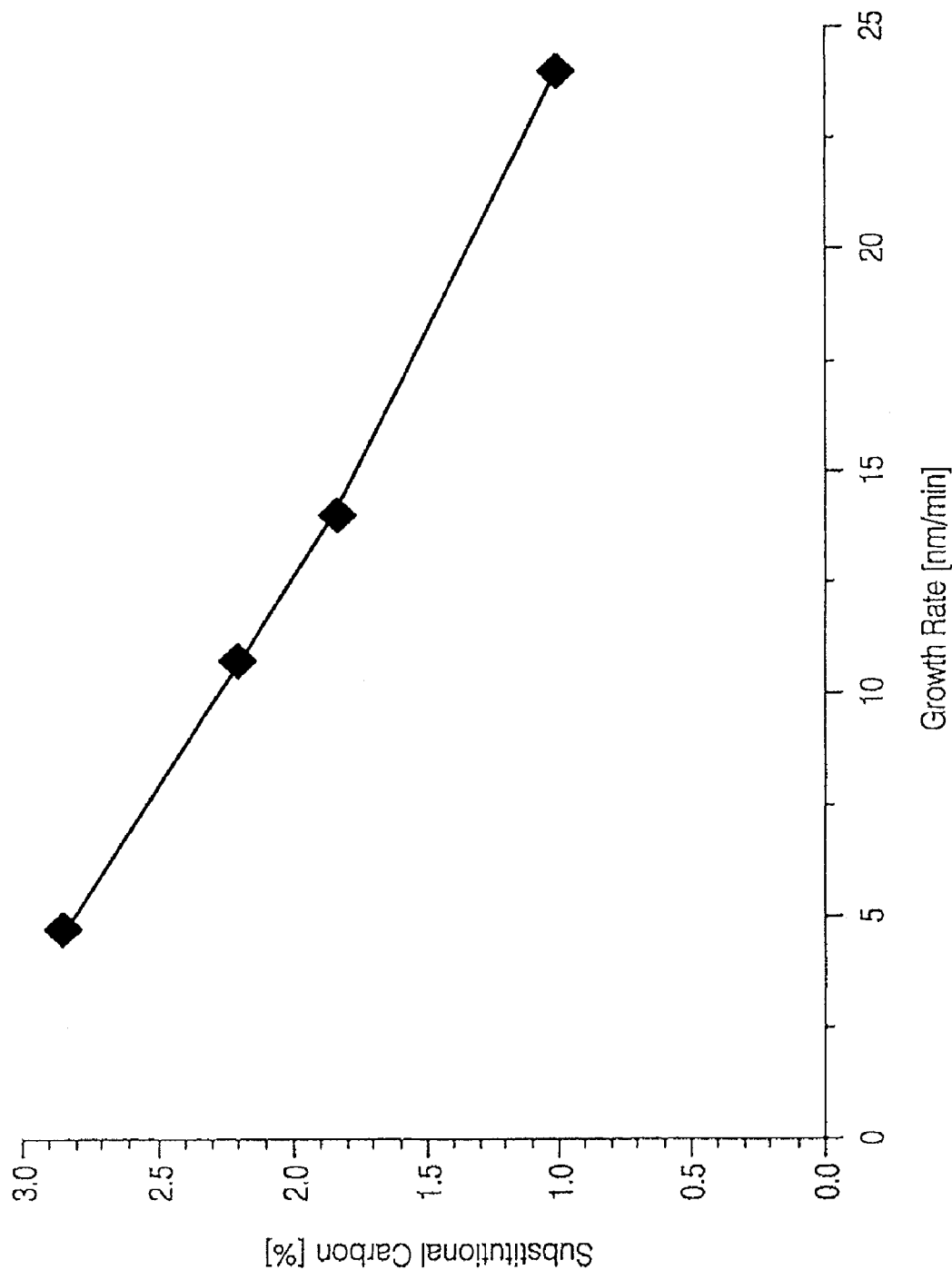
FIG. 2B shows the substitutional carbon content in the silicon films as a function of deposition rate (growth rate), at a constant monomethylsilane (MMS) flow rate.

FIGS. 2A and 2B are plots that illustrate the effects of trisilane flow rate (FIG. 2A) and growth rate (FIG. 2B) on substitutional carbon content at a constant MMS flow rate of 180 sccm, a deposition temperature of 550° C., a deposition pressure of 15 Torr, and a hydrogen carrier gas flow rate of 20 slm. FIG. 2A shows that increasing the trisilane flow rate (at constant MMS flow rate) results in lower levels of substitutional carbon content. The data shown in FIG. 2B are from the same set of experiments and show that increasing the growth rate (by increasing the trisilane flow rate as shown in FIG. 2A) at constant MMS flow rate results in lower levels of substitutional carbon content.

Figure 3B:
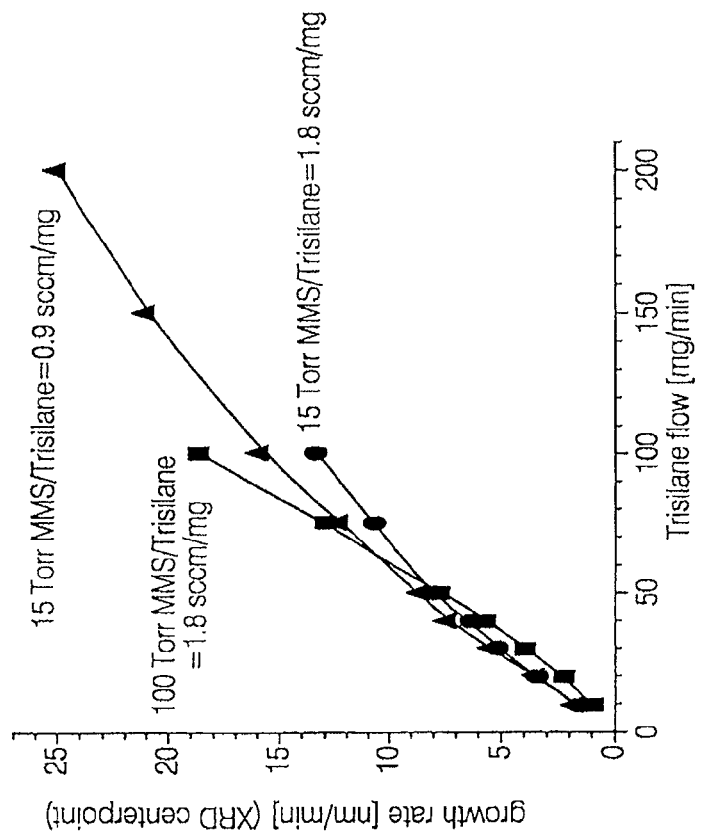
FIG. 3B shows a graph of growth rate as a function of trisilane flow rate.
Figure 3A:
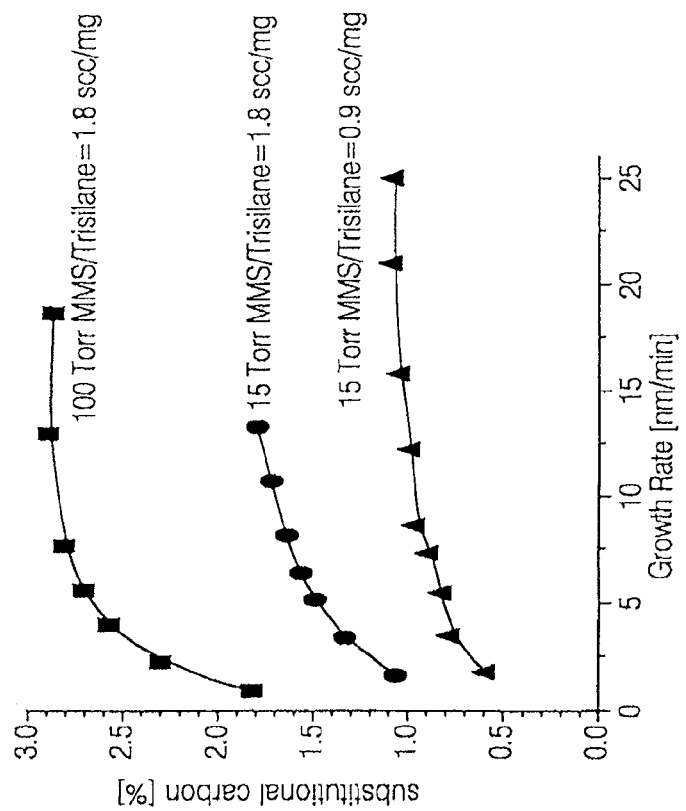
FIG. 3A shows a graph of substitutional carbon content in a silicon film as a function of film growth rate, at constant trisilane to MMS flow rate ratios.

FIG. 3A is a plot that illustrates the effects of growth rate on substitutional carbon content at various deposition pressures, for certain fixed MMS to trisilane flow rate ratios. As in FIG. 2, the data plotted in FIG. 3A were also obtained at a deposition temperature of 550° C. and at a hydrogen carrier gas flow rate of 20 slm. FIG. 3A shows that, at a given flow rate ratio of MMS to trisilane, increasing the growth rate results in higher levels of substitutional carbon content. FIG. 3A also shows that, at a given flow rate ratio of MMS to trisilane, increasing the deposition pressure results in higher levels of substitutional carbon content. The combination of relatively high deposition pressures and relatively high growth rates is particularly effective, producing a number of Si:C films that contain greater than 2.3 atomic % substitutional carbon.

FIG. 2B shows that, considered in isolation from other deposition parameters, increasing the growth rate without increased carbon source flow appears to result in lower levels of substitutional carbon content, whereas FIG. 3A shows that increasing the growth rate results in higher levels of substitutional carbon content. However, these results are not in conflict because it will be recognized that the data shown in FIG. 2B was obtained by increasing the trisilane flow rate at constant MMS flow rate, and thus at decreasing MMS to trisilane flow rate ratios, whereas the data shown in FIG. 3A was obtained at various fixed MMS to trisilane flow rate ratios. Thus, the decreases in substitutional carbon content illustrated in FIG. 2B result from the relatively smaller amount of MMS in the feed gas as the trisilane flow rate is increased, not from the increased deposition rate per se. At various constant MMS to trisilane flow rate ratios, increases in trisilane flow rate resulted in increased growth rates as illustrated in FIG. 3B (data obtained at a deposition temperature of 550° C. and at a hydrogen carrier gas flow rate of 20 slm). These increased growth rates produced the higher levels of substitutional carbon content illustrated in FIG. 3A.

Thus, FIG. 3A illustrates the effect of maintaining a constant trisilane to carbon source ratio while increasing the growth rate by simultaneously increasing the flow rates of both gases. FIG. 3A demonstrates that higher levels of substitutional carbon can be achieved at higher growth rates for a given ratio of trisilane to carbon precursor. FIG. 3B shows that growth rate is a strong positive function of trisilane flow rate, and that chamber pressure has a relatively modest effect on growth rate. Thus, taken together, FIGS. 1-3 illustrate various conditions under which relatively high deposition rates may be used to achieve high levels of substitutional carbon in single crystalline silicon.

Although deposition pressure has a relatively modest effect on growth rate, it has been found to substantially affect the crystal quality of the deposited Si:C films. For example, in one set of experiments, a series of epitaxial Si:C films were deposited using trisilane and MMS at a deposition pressure of 15 Torr and a deposition temperature of 550° C. in an Epsilon™ single wafer reactor. At a MMS flow rate of 70 sccm, a hydrogen carrier gas flow rate of 20 slm, and a deposition time of 15 minutes, an epitaxial Si:C film having a substitutional carbon content of 1.92 atomic % and a thickness of 410 Å was deposited. The epitaxial quality of the film was high and essentially all of the carbon was substitutional, as indicated by x-ray diffraction. However, increasing the film thickness and/or carbon content was found to result in lower epitaxial quality for the resulting Si:C film. For example, a second deposition conducted under essentially the same deposition conditions (except for a deposition time of 20 minutes) resulted in a thicker Si:C film having a slightly higher carbon content (1.96 atomic %), but the epitaxial quality of the second film was lower than the first, with x-ray diffraction indicating lower crystallinity. Thus, under these conditions (including a deposition pressure of 15 Torr), increasing the thickness and carbon content of a Si:C film resulted in a decrease in epitaxial film quality. However, by using a higher deposition pressure, it was found that film thickness and/or carbon content could be increased while maintaining high epitaxial film quality. For example, a third Si:C film was deposited under essentially the same conditions as the first film, except that the deposition pressure was higher (40 Torr) and the MMS flow rate was lower (46 sccm). The resulting film had a substitutional carbon content of 1.99 atomic % and a thickness of 630 Å. Despite the lower MMS flow rate, the substitutional carbon content of the third film was slightly higher than the first film, and the growth rate was higher (increased from about 27 nm/min to about 32 nm/min). In addition, despite the increase in both thickness and carbon level, the epitaxial quality of the third film was comparable to the first, as determined by x-ray diffraction. As another example, a fourth Si:C film was deposited under essentially the same conditions as the first and third films, except that the deposition pressure was higher (90 Torr) and the MMS flow rate was lower (36 sccm). The resulting film had a substitutional carbon content of 2.27 atomic % and a thickness of 385 Å. Despite the lower MMS flow rate, the substitutional carbon content of the third film was significantly higher than both the first and third films. In addition, the epitaxial quality of the fourth film was comparable to both the first and third films, as determined by x-ray diffraction For trisilane depositions conducted in single wafer reactors such as the preferred Epsilon™ series reactors, trisilane flow rates are suitably in the range of about 5 mg/min (milligrams per minute) to about 2,000 mg/min, preferably in the range of about 50 mg/min to about 500 mg/min, more preferably about 100 mg/min to about 300 mg/min; carbon source (e.g., MMS) flow rates are preferably in the range of about 80 sccm to about 1000 sccm; ratios of carbon source flow rates to trisilane flow rates are preferably in the range of from about 0.5 standard cubic centimeters of carbon source per milligram trisilane (scc/mg) to about 8.0 scc/mg, more preferably from about 0.9 to about 3.0 scc/mg; carrier gas flow rates are preferably in the range of from about 1 slm to about 50 slm, more preferably about 10 slm to about 40 slm; deposition rates are preferably at least about 5 nm per minute, more preferably at least about 10 nm per minute; deposition pressures are preferably in the range of from about 1 Torr to about 200 Torr, more preferably about 10 Torr to about 100 Torr, even more preferably about 20 Torr to about 100 Torr; and deposition temperatures in the range of from about 450° C. to about 600° C., more preferably in the range of from about 500° C. to about 575° C. Those skilled in the art can adapt these conditions to various types of equipment and deposition configurations, using the guidance provided herein and routine experimentation. For example, the skilled artisan can readily adapt these conditions to deposit Ge-doped Si and carbon-doped SiGe.

As mentioned above, the aforementioned carbon-doped single crystalline Si-containing films may further comprise an electrically active dopant, e.g., a dopant selected from the group consisting of phosphorous and arsenic. In general, the presence of substitutional carbon results in scattering that tends to increase resistivity, as compared to an otherwise similar electrically-doped single crystalline Si-containing film that does not contain substitutional carbon. However, when deposited using trisilane as described herein, it has been found that such electrically-doped single crystalline Si-containing films may still have surprisingly low resistivities, despite the presence of the carbon. For example, when doped (preferably substitutionally doped) with an electrical dopant, the single crystalline Si-containing film comprising substitutional carbon may have a resistivity of about 1.0 mΩ·cm or less, preferably about 0.7 mΩ·cm or less. In experiments, a lattice spacing of about 5.323 Å (as measured by X-ray diffraction) has now been achieved for arsenic-doped Si:C deposited from trisilane, arsine and MMS. This lattice spacing of 5.323 Å corresponds to a substitutional carbon level of about 3.25%.

Figure 4A:
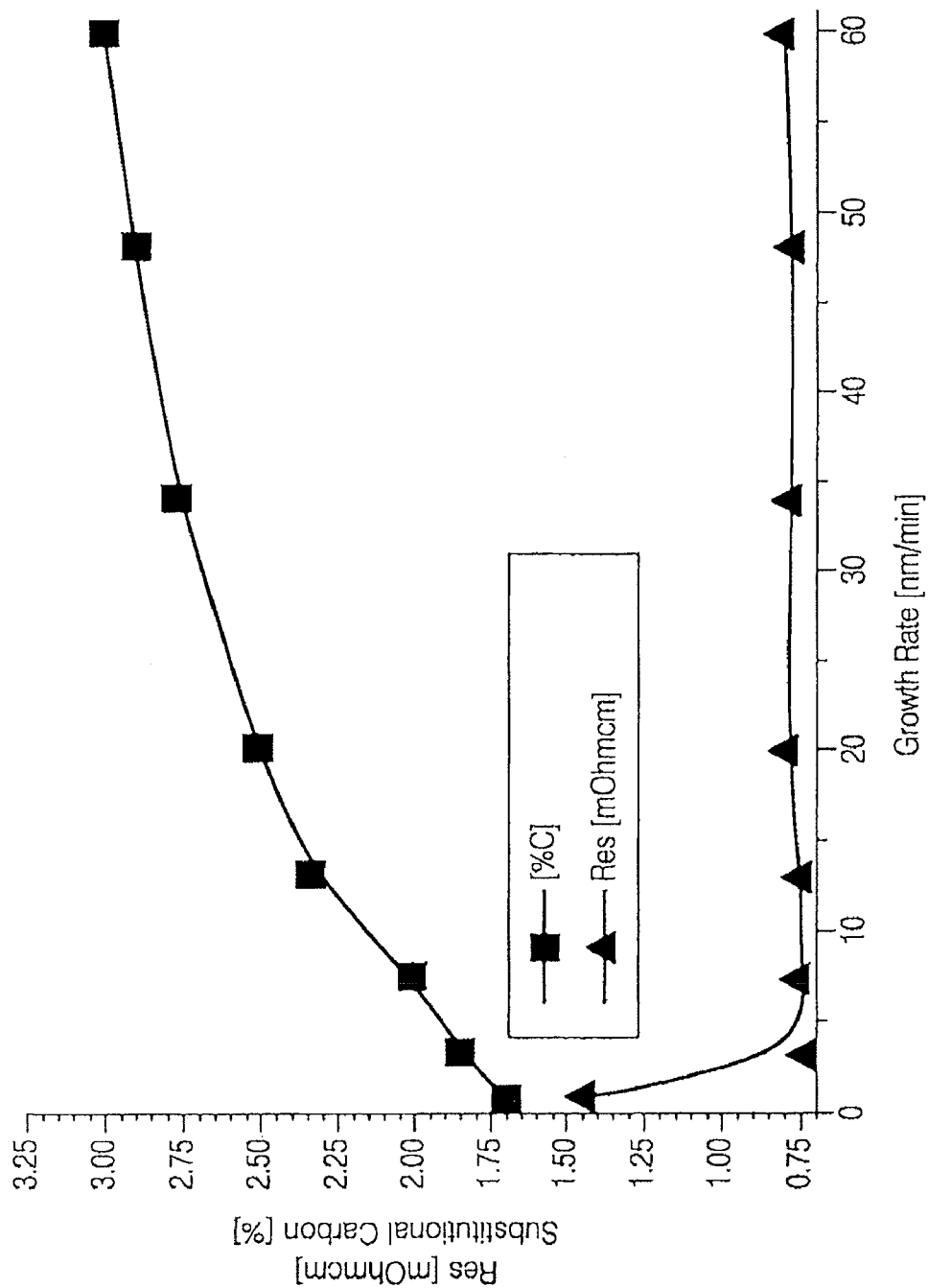
FIG. 4A shows a graph of substitutional carbon content as a function of growth rate for silicon films substitutionally doped with both carbon and arsenic. The graph also shows the resistivity of those films (units of mΩ·cm, also left axis).

For example, FIG. 4A is a graph showing percent substitutional carbon as a function of growth rate (nm/min) for silicon films substitutionally doped with both carbon and arsenic. FIG. 4A also shows the resistivity of those films (Res, units of mΩ·cm, also left axis). FIG. 4A demonstrates that Si-containing films may be deposited that contain various levels of substitutional carbon (e.g., about 1.7 atomic % to about 3.25 atomic % in the illustrated embodiments) and that contain various amounts of an electrically active dopant (arsenic in the illustrated embodiment). The combination of the electrically active dopant and the substitutional carbon produces films having desirably low resistivity values (e.g., about 0.7 mΩ·cm to about 1.45 mΩ·cm in the illustrated embodiments).

A single crystalline silicon film comprising relatively high levels of substitutional carbon as described herein (e.g., films comprising 2.4% or greater substitutional carbon) may exhibit various levels of tensile stress because the substitutional carbon atoms are smaller than the silicon atoms that they replace in the crystalline silicon lattice structure. In an embodiment, a single crystalline silicon film comprising 2.4% or greater substitutional carbon has a tensile stress of about 1.0 GPa or greater, e.g., about 1.5 GPa or greater, preferably about 1.7 GPa or greater, more preferably about 1.85 GPa or greater, even more preferably about 2.0 GPa or greater. The stress may be determined in any particular direction within the film. For example, for overlying silicon films comprising substitutional carbon that are deposited onto underlying crystalline silicon substrates, the overlying silicon film may exhibit a perpendicular stress (i.e., stress measured perpendicular to the film/substrate interface) that is different from the parallel stress (i.e., stress measured parallel to the film substrate interface). See, e.g., FIG. 3.1 at page 62 of the aforementioned article by Hoyt.

Stress may be introduced by heteroepitaxial deposition of the Si:C film onto a suitable substrate. For example, an arsenic-doped Si:C film having a substitutional carbon level of about 3.25 atomic % (lattice spacing of 5.323 Å) may be deposited onto a single crystal silicon substrate. When constrained to such a template (having a lattice spacing of about 5.43 Å), the tensile stress in such a Si:C film amounts to 2.06 GPa. The stress may be varied by appropriate selection of the substrate and the amount of substitutional carbon in the Si:C film. In various embodiments, the stress produced in a heteroepitaxially deposited Si:C film is preferably between 1 GPa and 3 GPa. When the Si:C is deposited to less than the critical thickness of the material, the deposited layer remains tensile stressed. In an embodiment, an electrically doped Si:C film is configured to exert a strain on an adjacent layer. For example, a compressive strain may be exerted on a silicon film that is deposited onto an electrically doped relaxed Si:C layer. In an embodiment, an electrically doped Si:C film formed in a recessed source/drain region exerts a tensile strain on a silicon channel formed between the source and drain, as described in greater detail below. Such configurations may be used in various applications, e.g., to improve electron mobility for NMOS devices.

Figure 4B:
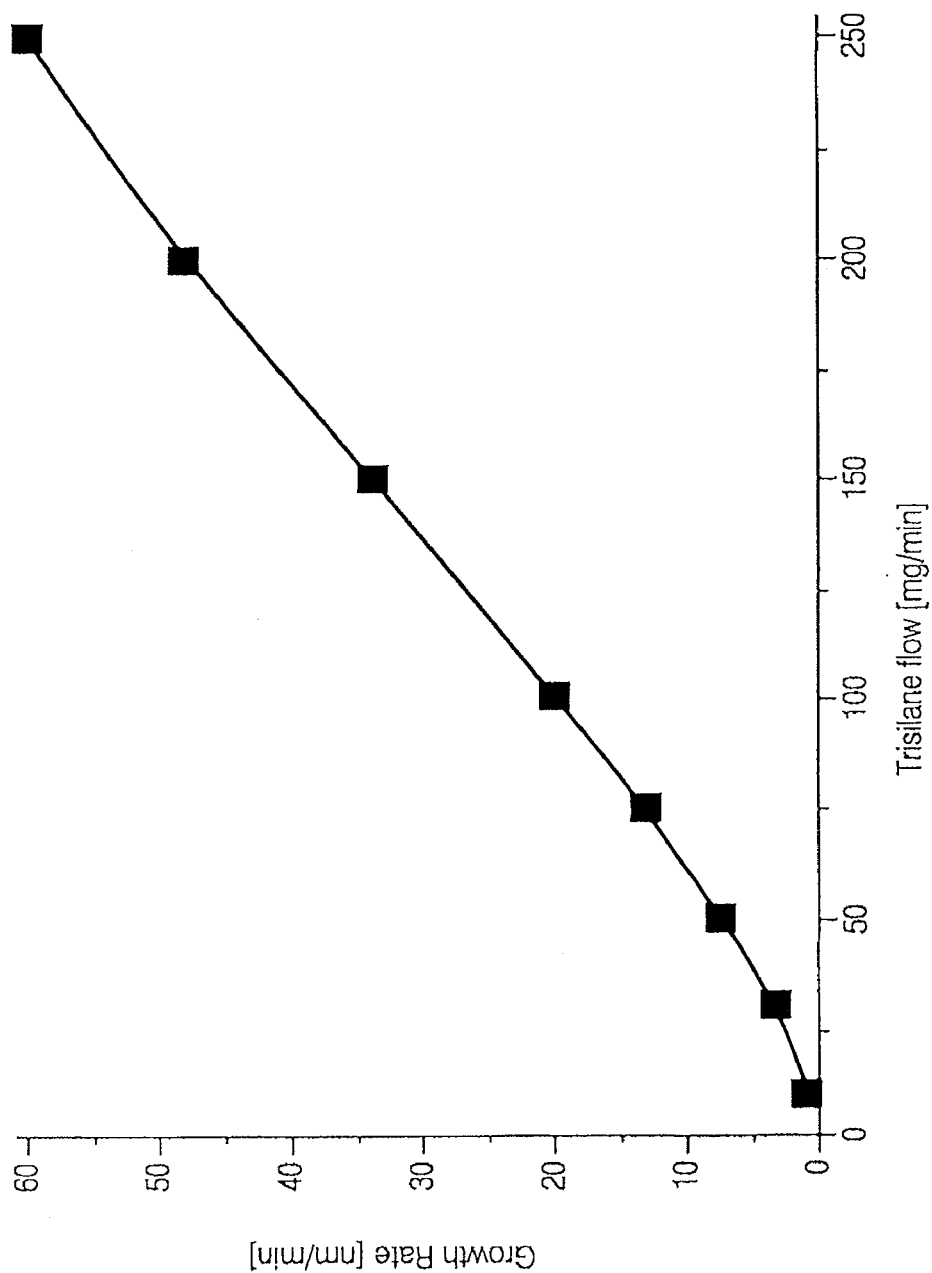
FIG. 4B is a plot showing the growth rate of those films as a function of trisilane flow rate.

FIG. 4B shows the growth rate of electrically-doped Si:C films as a function of trisilane flow rate (mg/min). The plots shown in FIGS. 4A and 4B demonstrate that high levels of substitutional carbon and low resistivities may be achieved using trisilane by carrying out the depositions at a relatively high deposition (growth) rate, e.g., at least about 5 nm/min. As illustrated in FIG. 4B, the growth rates may be E controlled, e.g., by controlling the trisilane flow rates and deposition temperatures, to produce single crystalline films that comprise various levels of carbon, e.g., 2.5% or greater substitutional carbon, preferably 2.6% or greater substitutional carbon, more preferably 2.7% or greater substitutional carbon. In some embodiments, the single crystalline films may comprise even higher levels of carbon, e.g., 2.8% or greater substitutional carbon, preferably 2.9% or greater substitutional carbon, more preferably 3.0% or greater substitutional carbon, as indicated in FIG. 4A.

Figure 5:
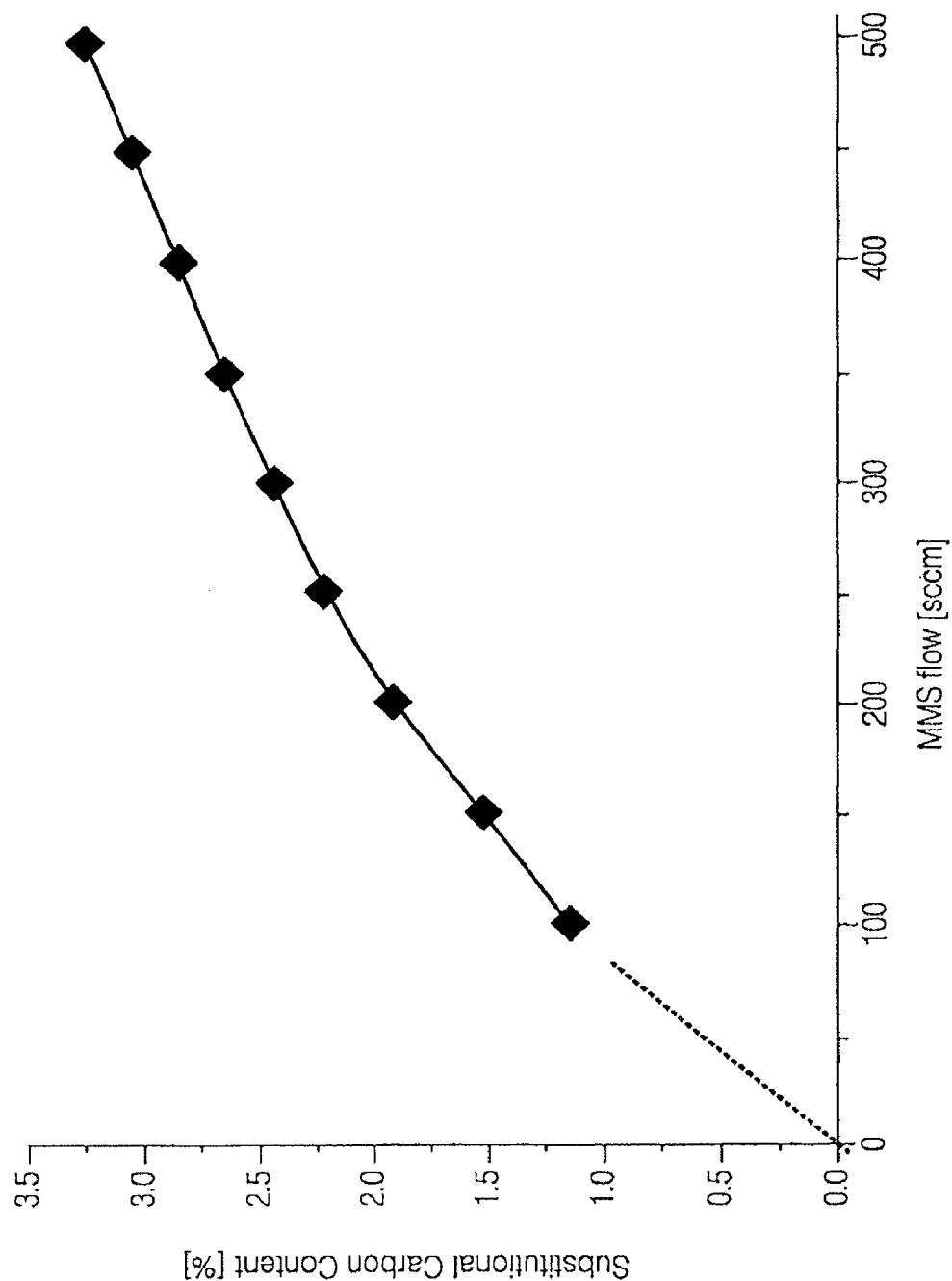
FIG. 5 shows a graph of substitutional carbon content in an arsenic-doped Si:C film as a function of MMS flow rate, at a constant trisilane flow rate (200 mg/min) and at a constant arsine flow rate (100 sccm of 1% $AsH_3$ in $H_2$).

FIG. 5 shows a graph of substitutional carbon content in an arsenic-doped Si:C film as a function of MMS flow rate, at a constant trisilane flow rate (200 mg/min) and at a constant arsine flow rate (100 sccm). FIG. 5 shows that higher substitutional carbon levels are obtained at higher MMS flow rates under these conditions. Because the trisilane flow rate was constant and the carbon source (MMS) flow rate was varied, FIG. 5 illustrates the effect on substitutional carbon content of varying the flow rate ratio of carbon source to trisilane. As the flow rate ratio of MMS to trisilane increased, the amount of substitutional carbon in the resulting film increased relatively linearly, in accordance with the results discussed above with respect to FIGS. 1-3. FIG. 5 also illustrates that the general principles taught herein for the deposition of Si:C films are applicable to the deposition of electrically doped Si:C films (e.g., doped with arsenic as illustrated in FIG. 5), with appropriate adaptations using routine experimentation in light of the guidance provided herein.

Figure 6A:
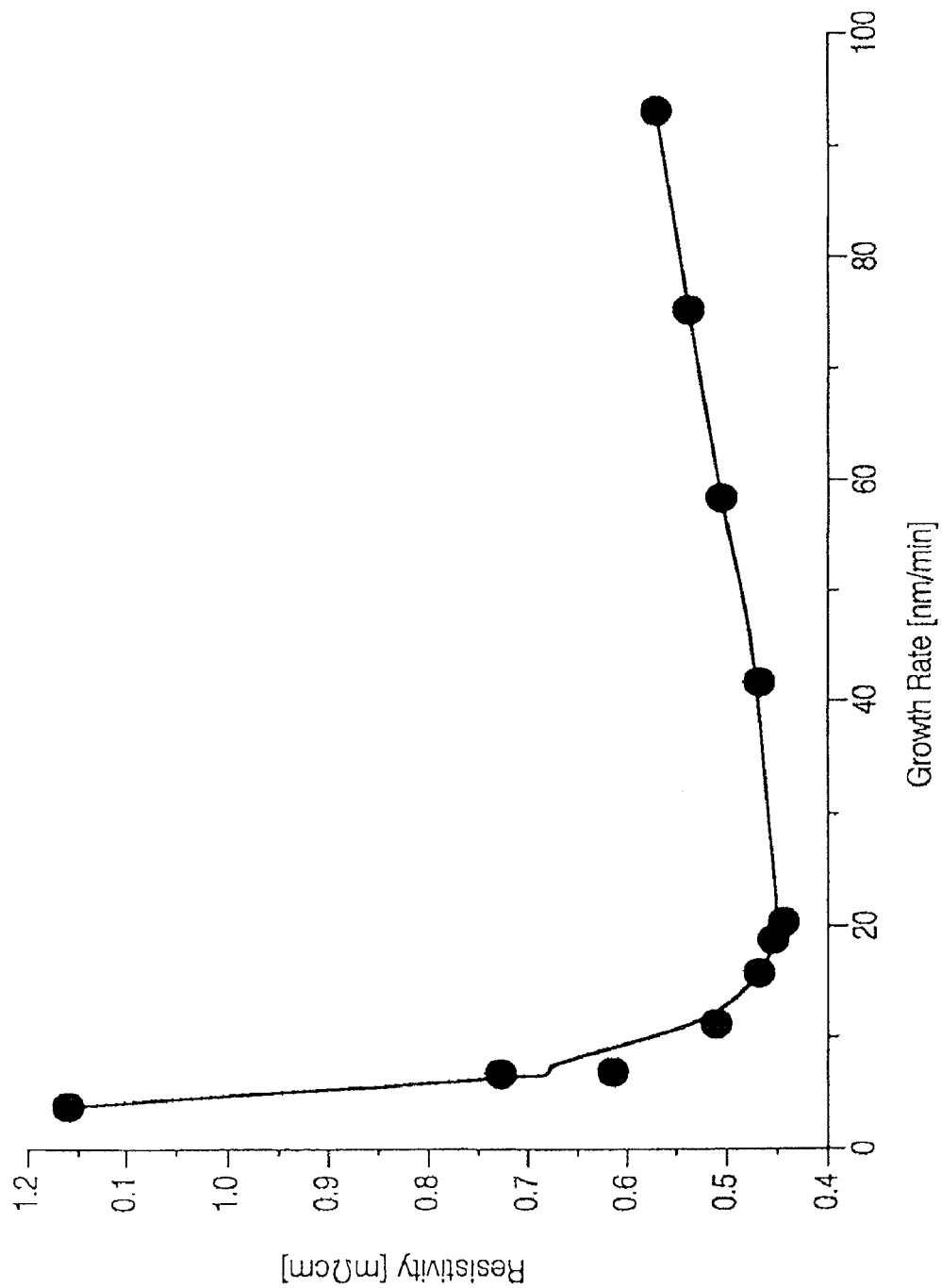
FIG. 6A shows a graph of arsenic-doped Si film resistivity as a function of growth rate for a series of films deposited at a constant flow rate ratio of trisilane to arsine.
Figure 6B:
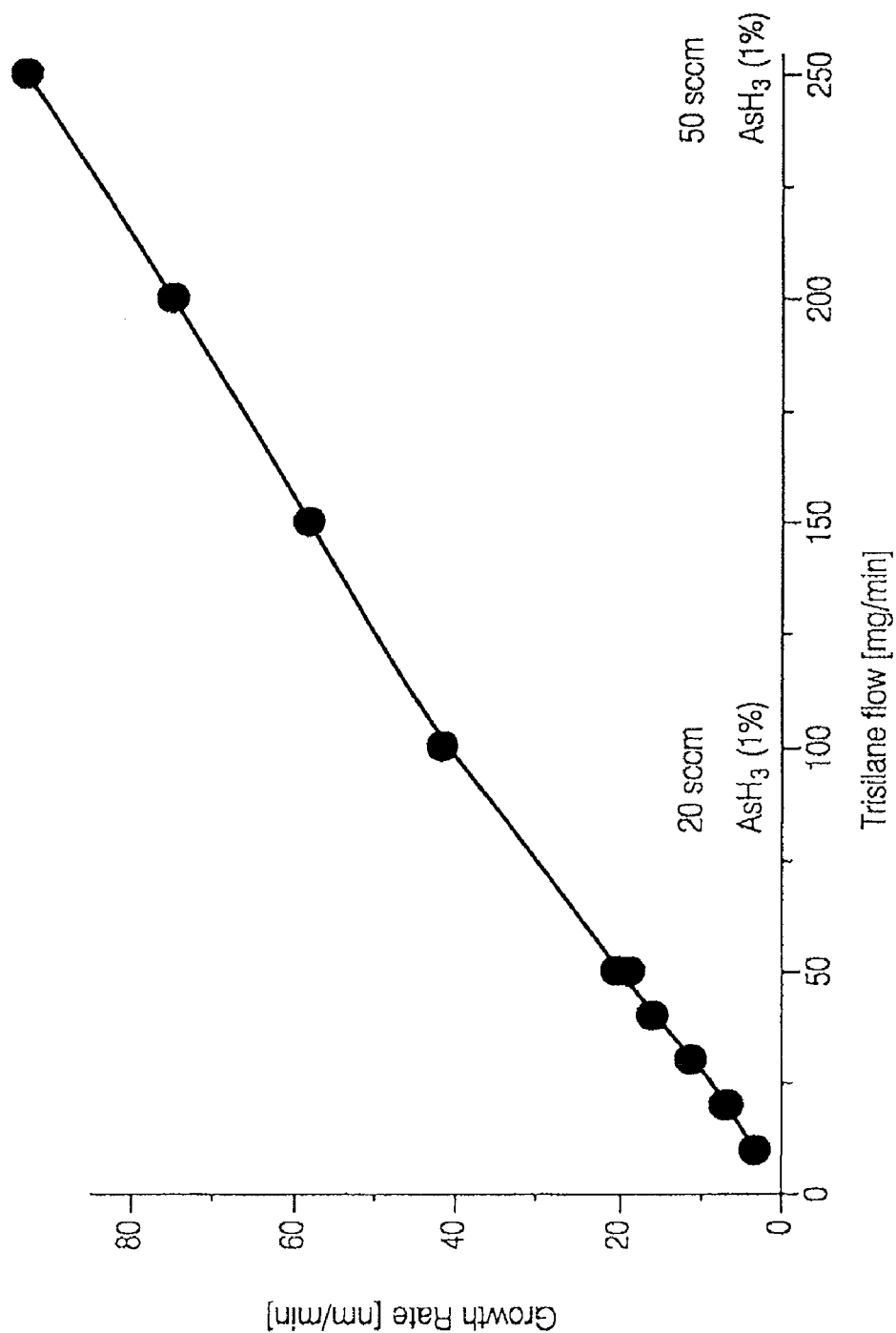
FIG. 6B shows a graph of film deposition (growth) rate as a function of trisilane flow rate, at a constant flow rate ratio of trisilane to arsine.

FIG. 6A is a graph of arsenic-doped Si film resistivity as a function of growth rate for a series of films deposited at a constant flow rate ratio of trisilane to arsine. FIG. 6B is a plot of film deposition rate as a function of trisilane flow rate. FIG. 6 is similar to FIG. 3 in the sense that the data was obtained at a constant flow rate ratio of trisilane to substitutional dopant precursor (MMS in FIG. 3, $AsH_3$ in FIG. 6). FIG. 6 demonstrates that silicon film resistivity values of about 1.0 mΩ·cm or less may be achieved using trisilane by conducting the depositions at a relatively high rate, e.g., at least about 5 nm per minute, more preferably at least about 10 nm per minute. As illustrated in FIG. 6B, the growth rate of doped silicon films is a substantially linear function of the flow rate of trisilane. FIGS. 3 and 6 demonstrate that the use of trisilane enables relatively high rate depositions that in turn enable surprisingly high levels of substitutional doping. The similarities among FIGS. 3 and 6, despite the known differences among carbon and arsenic, demonstrate that deposition methods using trisilane as taught herein are relatively insensitive to the nature of the dopant or dopant precursor. Thus, the relatively high rate deposition methods using trisilane that are described herein are applicable to a wide variety of dopants (such as carbon, germanium and electrically active dopants), and to the incorporation of those dopants into a wide variety of Si-containing materials (such as Si, Si:C, SiGe, SiGeC, etc.). Examples of suitable high deposition rates include deposition rates of about 5 nm/min or greater, preferably about 10 nm /min or greater. Even higher deposition rates may be used, e.g., about 20 nm/min or greater, preferably about 50 nm/min or greater, even more preferably about 100 nm/min or greater. Routine experimentation may be used to select high rate deposition conditions applicable to a particular Si-containing material.

In some embodiments, the thickness of a single crystalline silicon film comprising a strain-modifying amount of a substitutional dopant such as carbon as described herein is preferably less than a critical film thickness. Those skilled in the art understand that a critical film thickness is a film thickness at which a strained film relaxes under a particular set of conditions. As the concentration of substitutional dopant increases, the critical thickness generally decreases. Films having a thickness less than the critical thickness typically remain strained under those conditions. For example, a single crystalline silicon film comprising about 1.8 atomic % substitutional carbon may have a critical thickness of about 200 nm at 550° C., whereas an otherwise similar film comprising 3.5 atomic % substitutional carbon may have a critical thickness of about 25-30 nm at the same temperature. Films having a thickness that is less than a critical thickness for that film will tend to remain strained unless or until sufficiently perturbed (e.g., exposed to sufficient heat to cause relaxation).

Figure 7:
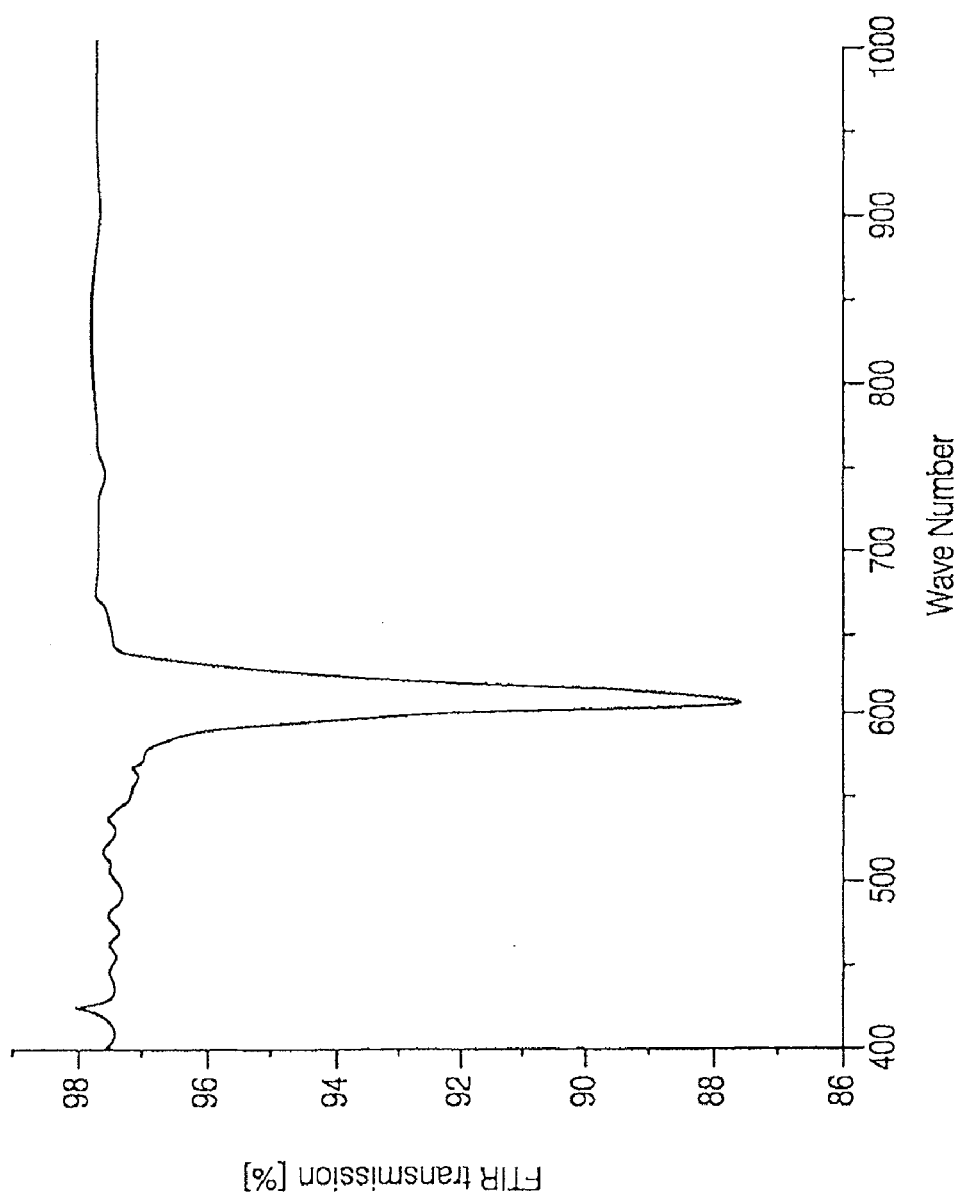
FIG. 7 shows a portion of a Fourier Transform Infrared (FTIR) spectrum for a silicon film substitutionally doped with carbon in accordance with preferred embodiments.

FIG. 7 shows a portion of an FTIR spectrum for a crystalline silicon film (200 nm thick) substitutionally doped with 1.8 atomic % carbon. The strong absorption at about 605 wavenumbers demonstrates the presence of substitutional carbon in the silicon film. The lack of a broad absorption band at about 450 to 500 wavenumbers demonstrates that the silicon film contains little (if any) non-substitutional carbon. Thus, an embodiment provides a single crystalline Si-containing film comprising 2.4 atomic % or greater substitutional carbon, preferably about 2.7 atomic % or greater substitutional carbon, more preferably about 3.0 atomic % substitutional carbon, the film comprising less than about 0.3 atomic % non-substitutional carbon, preferably less than about 0.25 atomic % non-substitutional carbon, more preferably less than about 0.20 atomic % non-substitutional carbon, even more preferably less than about 0.15 atomic % non-substitutional carbon.

As is known in the art, the lattice constant for single crystal silicon is about 5.431 Å, whereas single crystal germanium has a lattice constant of 5.657 due to the larger size of the germanium atoms. The deviation from silicon's natural lattice constant resulting from substitutional germanium incorporation introduces strain that advantageously improves electrical carrier mobility in semiconductors, improving device efficiency. When the SiGe is deposited to less than the critical thickness of the material, the deposited layer remains compressively strained and hole mobility is improved for PMOS devices. In such a case, the deposited SiGe layer can be selectively formed, e.g., over an entire active area and can define the channel, or it can act as a relaxed template for forming a compressively strained layer thereover, which can then itself serve as a channel region.

In the embodiments of FIGS. 8-13(described below), however, the Si:C layer is selectively formed in recessed source/drain regions 20, and is preferably deposited under conditions (thickness, temperature) that maintain stress. The smaller lattice constant of the Si:C material filling the S/D recesses exerts tensile strain on the channel region 22 therebetween. Preferably a dopant hydride is added to the process flow, in addition to trisilane, an etchant and a carbon source. Preferably an n-type dopant, and more preferably phosphine or arsine, is employed. A Si:C film comprising substitutional carbon may also be formed in source/drain regions by a blanket deposition and etching sequence, in a manner similar to that illustrated in FIGS. 14A-14C. The process described below for the selective deposition of Si:C in the recessed source/drain regions 20 may be adapted by those skilled in the art to selectively deposit a variety of Si-containing materials using routine experimentation in view of the guidance provided herein.

The processes described herein are useful for depositing Si-containing films on a variety of substrates, but are particularly useful for depositing Si-containing films over mixed substrates having mixed surface morphologies. As noted above, the term "mixed substrate" is known to those skilled in the art, see U.S. Pat. No. 6,900,115.

An embodiment provides a method for selectively depositing a carbon-doped single crystalline Si-containing film onto the single crystal region(s) of a mixed substrate. In addition to the uniformity and high quality films obtained by use of trisilane, as disclosed, e.g., in U.S. Pat. No. 6,821,825, it has been found that excellent selectivity can be obtained by the use of trisilane in combination with an etchant, e.g., a chlorine-containing etchant such as HCl, hexachlorodisilane ($Si_2Cl_6$) or chlorine gas ($Cl_2$). Experiments have shown that selectivity can be 100% (i.e., with zero deposition on surrounding insulators such as silicon oxide and silicon nitride). HCl may be provided as an etchant to selective silicon-based deposition processes, where the etch effects upon slow-nucleating deposition on amorphous (typically insulating) surfaces is greater than the etch effects on exposed semiconductor surfaces. Chlorine is preferred as HCl is notoriously difficult to purify and typical commercial sources of HCl introduce excessive moisture into the deposition process. Such moisture can lower the conductivity of deposited films, and cause unacceptable levels of defects in epitaxial deposition. Accordingly, the use of a feed gas comprising trisilane, a carbon source and chlorine advantageously achieves high levels of selectivity without added etchants, and particularly without HCl.

Preferably, the feed gas is introduced to the chamber along with a hydrogen carrier gas, using a relatively high trisilane flow rate and a relatively low hydrogen flow rate, as compared to standard use of silane as the sole silicon precursor. The flow rate of the carbon source is selected to achieve the desired level of incorporation of substitutional carbon, as discussed in detail above for the incorporation of substitutional carbon with respect to FIGS. 1-5. For example, in a preferred embodiment thermal CVD is carried out in an Epsilon E2500™, E3000™ or E3200™ reactor system (available commercially from ASM America, Inc., of Phoenix, Ariz.) using a trisilane flow rate of about 5 mg/min to 2,000 mg/min, more preferably between about 10 mg/min and 200 mg/min, and a carbon source flow rate of about 4 sccm to about 500 sccm. Ratios of carbon source flow rates to trisilane flow rates are preferably in the range of from about 0.5 scc/mg to about 8.0 scc/mg, more preferably from about 0.9 scc/mg to about 3.0 scc/mg. The hydrogen flow rate may be about 40 standard liters per minute (slm) or less, preferably about 10 slm or less, more preferably about 5 slm or less, and the deposition temperature may be in the range of about 450° C. to about 700° C., more preferably about 500° C. to about 650° C. Hydrogen gas flow rates are preferably minimized during deposition with trisilane and chlorine-containing etchants. Etchant flow rates are preferably about 20 sccm to about 200 sccm. Experiments were carried out with trisilane flows of 25-400 mg/min, $H_2$ carrier flow rates of 0-4 slm, and chlorine flow rates of 25-200 sccm. Dopant precursor (e.g., carbon source and/or electrical dopant precursor) flow rates are typically in the range of from about 5 sccm to about 500 sccm, depending on the nature of the dopant source and the relative flow rates of the other components. For example, for phosphorus doping, dopant hydride (precursor) flow rates are preferably from 10-200 sccm of phosphine (1% $PH_3$ in $H_2$).

Figure 8:
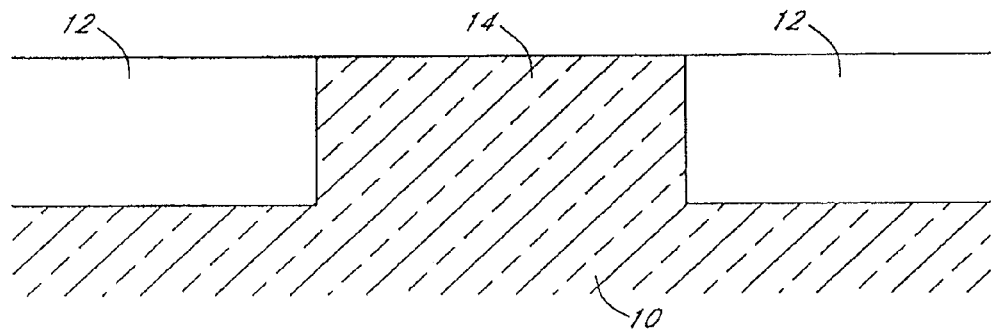
FIG. 8 is a schematic cross section of a semiconductor substrate after field oxide definition, leaving insulator and semiconductor surfaces exposed.

FIG. 8 is a schematic cross-sectional view showing a substrate 10 comprising a silicon wafer in the illustrated embodiment. The substrate 10 can include an epitaxial layer formed over a wafer or an SOI substrate. Field isolation regions 12 have been formed by conventional shallow trench isolation (STI) techniques, defining active areas 14 in windows among the STI elements. Alternatively, any suitable method can be used to define field insulating material, including local oxidation of silicon (LOCOS) and a number of variations on LOCOS or STI. It will be understood that several active areas are typically defined simultaneously by STI across the substrate 10, and that the STI often forms a web separating transistor active areas 14 from one another. The substrate is preferably background doped at a level suitable for channel formation.

Figure 9:
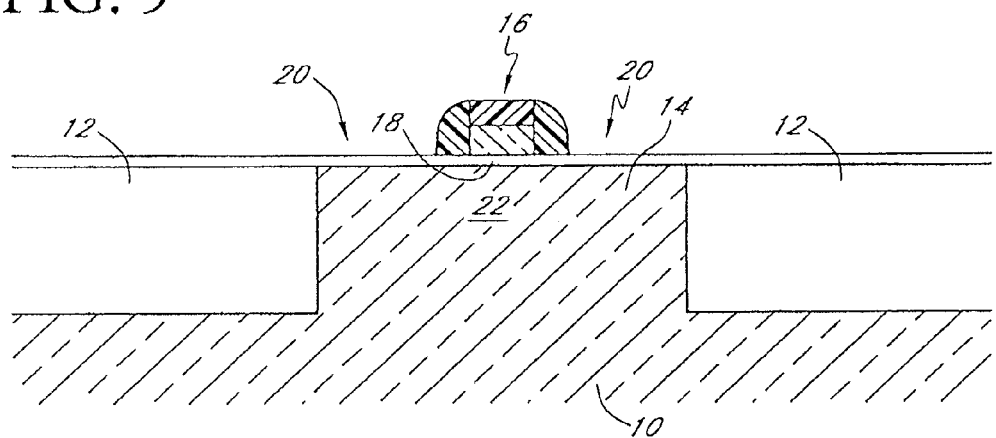
FIG. 9 shows the structure of FIG. 8 after formation of a transistor gate electrode within an active area window.

FIG. 9 illustrates the substrate 10 after formation of a gate electrode 16 over the active area 14. While illustrated as a traditional silicon electrode, surrounded by insulating spacers and cap layers, and separated from the underlying substrate 10 by a gate dielectric layer 18, it will be understood that the transistor gate stack can have any of a variety of configurations. In some process flows, for example, the spacers can be omitted. In the illustrated embodiment, the definition of the gate electrode 16 defines source and drain regions 20 on either side of the transistor gate electrode 16 within the active area 14. The gate electrode 16 also defines a channel region 22 under the gate electrode 16 and between the source and drain regions 20.

Figure 10:
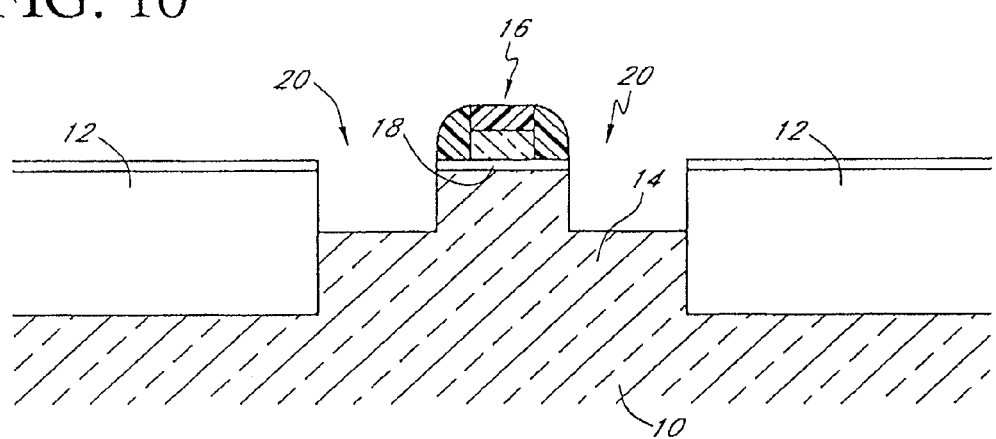
FIG. 10 shows the structure of FIG. 9 after recessing source and drain regions on either side of the gate electrode.

FIG. 10 illustrates the result of an etch step that selectively removes exposed silicon. Preferably a reactive ion etch (RIE) is employed to ensure vertical sidewall definition and minimal damage to exposed oxide and nitride materials. Preferably the depth of the recesses is less than the critical thickness of the layer to be deposited in the recess although strain on the channel can also be obtained by deposition greater than the critical thickness. As the exposed silicon is essentially the source and drain (S/D) regions 20 of the active area 14, the etch is referred to as a source/drain recess. It will be understood that, in some arrangements, a first step of clearing the thin dielectric over the source/drain regions may be employed.

Figure 11:
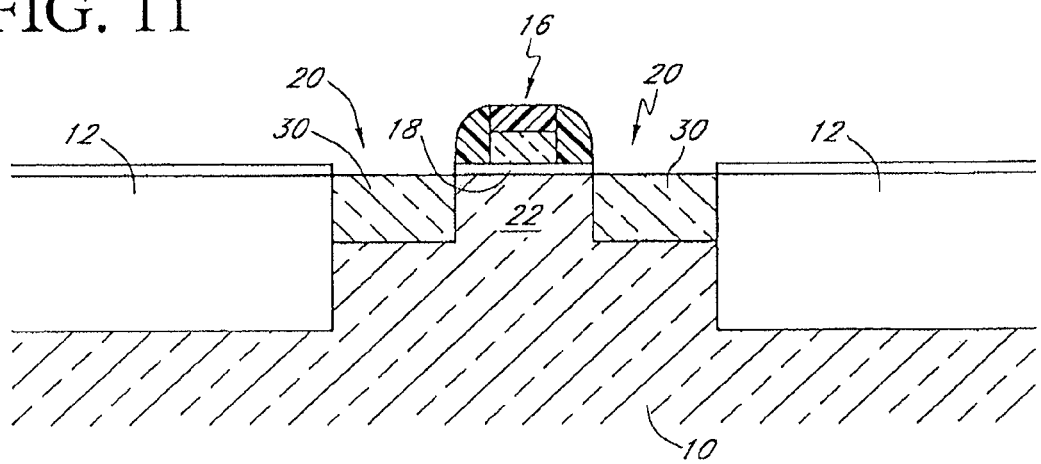
FIG. 11 shows the structure of FIG. 10 after selective deposition of a semiconductor film within the recessed regions, in accordance with a preferred embodiment.

FIG. 11 shows the result of refilling the recessed S/D regions 20 with a selective deposition process. In particular, the exposed semiconductor surfaces are cleaned, such as with an HF vapor or HF last dip, leaving a pristine surface for epitaxy thereover. Trisilane and chlorine are introduced as described above, along with a source of substitutional dopant. For the illustrated embodiment of FIGS. 8-13, the substitutional dopant comprises a carbon source in order to produce a substitutionally doped film that creates strain on the channel region, as described in more detail below. Preferably dopant hydrides are included in the process vapor mixture. A silicon-containing epitaxial layer grows selectively in the S/D regions 20. Advantageously, a selectively deposited, heteroepitaxial film 30 (comprising, e.g., substitutionally doped Si:C) fills the S/D regions 20 and exerts strain on the channel region 22. In the illustrated embodiment, the heteroepitaxial film 30 is approximately flush with the surface of the channel region 22. As illustrated, the selective deposition minimizes or avoids deposition over the amorphous regions, e.g., over the insulators include field isolation regions 12 (generally a form of silicon oxide) and the spacers cape on the gate electrode 16 (typically silicon nitride).

Figure 12:
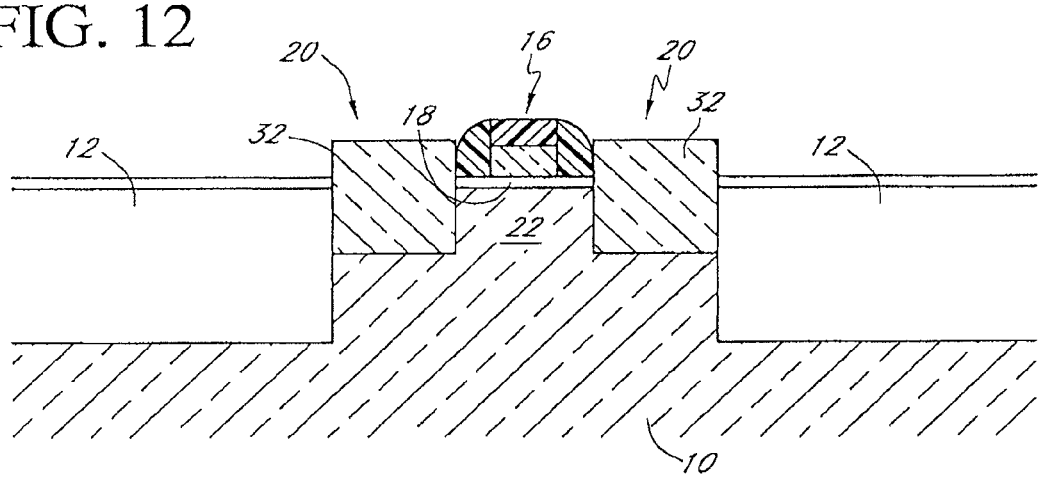
FIG. 12 shows the structure of FIG. 11 after optional continued selective deposition, forming elevated source/drain structures.

FIG. 12 illustrates an optional extension of the selective deposition to form elevated S/D regions 20 with the extended heteroepitaxial film 32. As the portion of the extended film 32 below the surface of the channel region 22 exerts lateral stress on the channel region 22, the portion above the surface of the substrate need not include as much or any lattice deviation from the natural silicon lattice constant. Accordingly, the carbon source gas can be tapered or halted for the portion of the selective deposition above the surface of the channel region 22, and trisilane and chlorine flows continued. Electrical dopant source gases, particularly dopant hydrides such as arsine or phosphine, are preferably continued.

The elevated S/D structure 32 of FIG. 12 advantageously provides additional silicon material above the surface of the substrate 10. As is known in the art, through subsequent processing, insulating layers are deposited and contacts are made through the insulating film to the source and drain regions 20. The additional silicon material facilitates formation of silicide contacts, which reduce contact resistance (form ohmic contacts). Accordingly, nickel, cobalt or other metal is deposited into the contact hole and allowed to consume the excess silicon without disturbing electrical properties of shallow junctions for the underlying source/drain regions.

Figure 13:
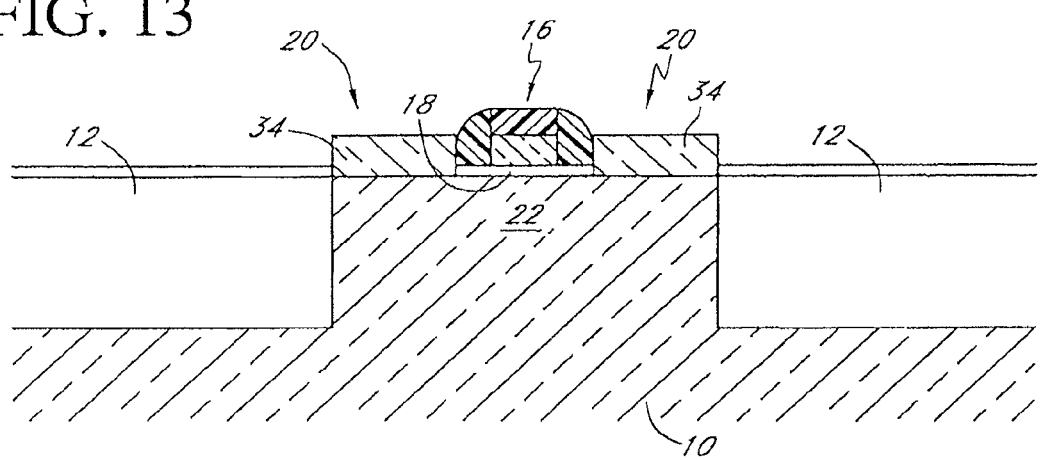
FIG. 13 shows the structure of FIG. 9 after exposing the semiconductor window and conducting a selective deposition to form elevated source/drain structures, in accordance with another preferred embodiment.

FIG. 13 shows another embodiment, in which the structure of FIG. 9 is subjected to the selective deposition using trisilane, a carbon source and chlorine, without the intervening S/D recess step. In this case, the selective deposition serves only to raise the source and drain regions, providing excess carbon-doped silicon 34 to permit consumption by contact silicidation without destroying shallow junctions. The deposition can optionally include electrical dopant precursors to deposit Si:C doped with an electrically active dopant. Such electrical dopants are unnecessary, however, if the entire excess silicon structure 34 is to be consumed by contact silicidation.

Advantageously, the selective nature of the trisilane/chlorine process obviates subsequent pattern and etch steps to remove excess deposition from over field regions. Even imperfect selectivity can advantageously permit use of a timed wet etch to remove unwanted deposition over insulating surfaces, rather than requiring an expensive mask step. Furthermore, superior film quality is obtained at relatively high deposition rates, improving throughput. For example, certain process embodiments may be used to selectively deposit boron-doped SiGeC using trisilane, methylsilane, $B_2H_6$, and chlorine to form, e.g., a base structure of a heterobipolar transistor (HBT).

Figure 14A:
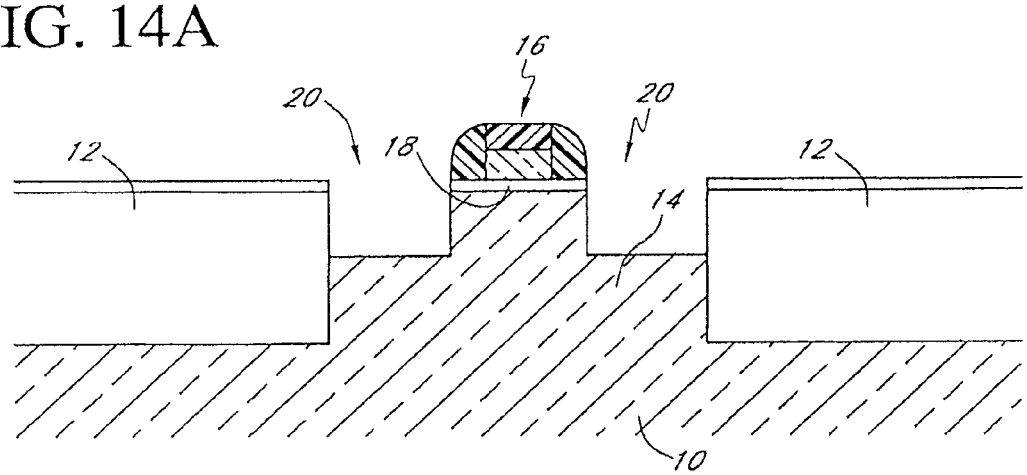
FIGS. 14A-C show a series of schematic cross sections of a semiconductor substrate and illustrate a method of forming source/drain regions by blanket deposition and etching, in accordance with another preferred embodiment.
Figure 14B:
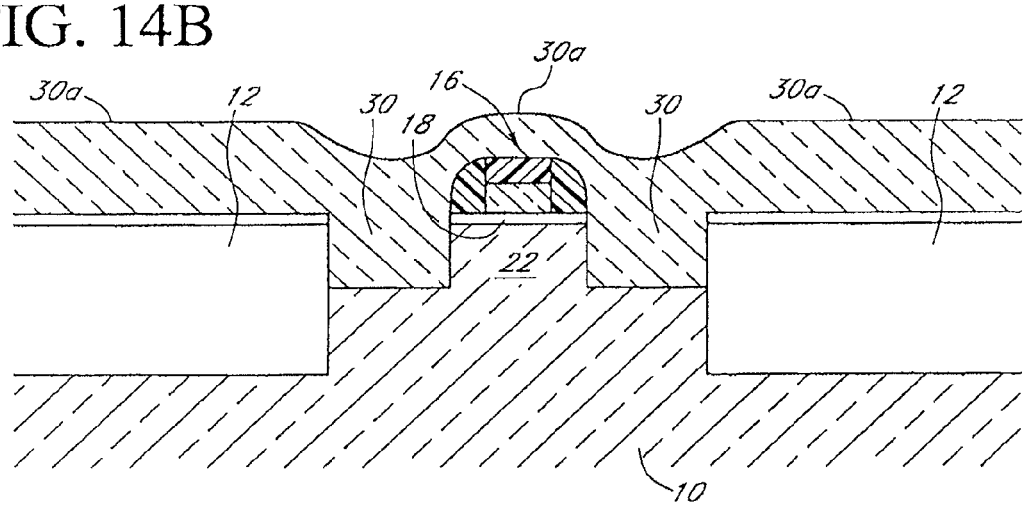

A Si:C layer may be selectively formed in recessed source/drain regions 20 as discussed above. However, the Si:C layer may also be formed by a process that involves a blanket deposition of the Si:C layer, followed by etching so that single crystalline Si:C remains in the recessed source/drain regions 20. An embodiment of such a process is illustrated by the sequence shown in FIGS. 14A-14C. FIG. 14A is identical to the structure shown in FIG. 10 and may be formed in the same manner. In contrast to the selective deposition process illustrated in FIG. 11 however, FIG. 14B shows the result of a blanket deposition process in which a heteroepitaxial Si:C film 30 fills the source/drains regions 20, and in which a polycrystalline Si:C film 30a is deposited over the field isolation regions 12 and the gate electrode 16. The methods described above for depositing a single crystalline silicon film that comprises substitutional carbon may be employed to deposit the single crystalline Si:C film 30 and the polycrystalline Si:C film 30a. The single crystalline Si:C film 30 is preferably deposited under conditions (thickness, temperature) that maintain stress, As discussed above, the smaller lattice constant of the Si:C material filling the source/drain recesses exerts tensile strain on the channel region 22 therebetween. Preferably a dopant hydride is added to the process flow, in addition to the trisilane and carbon source. Preferably arsine or phosphine are employed.

Figure 14C:
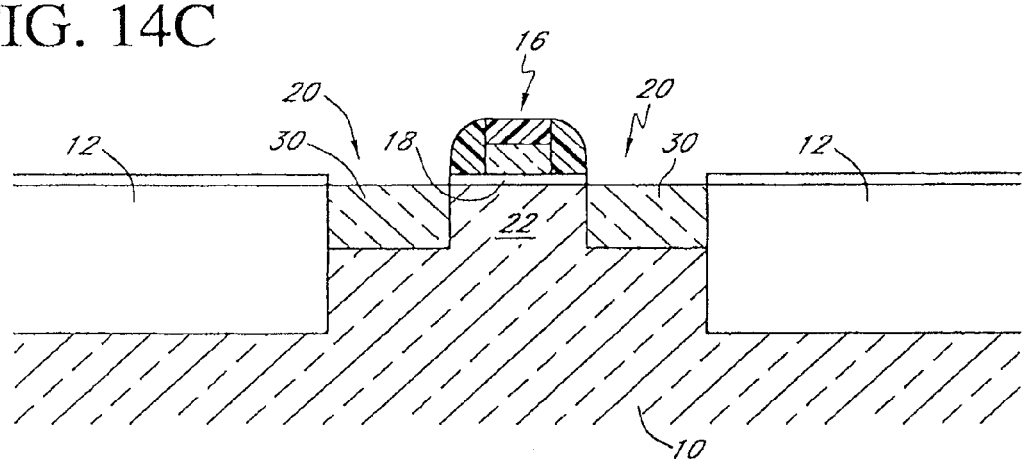

FIG. 14C is similar to FIG. 11 above, except that the depicted structure results from removing the polycrystalline Si:C film 30a using etching conditions that are selective for the removal of polycrystalline material against single crystal material. Such etching conditions are known to those skilled in the art.

The process illustrated in FIGS. 14A-14C may be used in various situations in which it is desirable to exert a tensile stress on a single crystalline Si-containing region (such as the channel region 22), and particularly to increase the carrier mobility in the tensile stressed region (the region to which the tensile stress is applied, such as the channel region 22). Preferably, the carrier mobility (e.g., electron mobility) is increased by at least about 10%, more preferably by at least about 20%, as compared to a comparable region that is substantially identical to the tensile stressed region except that it is not tensile stressed.

Thus, an embodiment provides an integrated circuit comprising a first single crystalline Si-containing region and a second single crystalline Si-containing region, at least one (preferably both) of the first single crystalline Si-containing region and the second single crystalline Si-containing region comprising an amount of substitutional carbon effective to exert a tensile stress on a third single crystalline Si-containing region positioned between the first single crystalline Si-containing region and the second single crystalline Si-containing region, the third single crystalline Si-containing region exhibiting an increase in carrier mobility of at least about 10%, more preferably by at least about 20%, as compared to a comparable unstressed region. The integrated circuit may comprise one or more transistors in which the first single crystalline Si-containing region comprises a source, the second single crystalline Si-containing region comprises a drain, and the third single crystalline Si-containing region comprises a channel. An example of such a transistor is illustrated in FIG. 14C, in which the first and second Si-containing regions comprise the source/drain 30, and the third single crystalline Si-containing regions comprises the channel 22.

Deposition of Si-containing films using trisilane as described herein can offer significant advantages over the use of conventional silicon sources when conducted as described herein. For example, at a given deposition temperature, deposition of Si-containing films using trisilane preferably proceeds at a rate that is significantly faster than when silane is used instead of trisilane. A preferred embodiment provides a high rate deposition method in which trisilane is delivered to the substrate surface at a delivery rate of about 50-200 mg/min. Under thermal CVD conditions, preferably at a deposition temperature in the range of about 500° C. to about 800° C., practice of this embodiment results in relatively fast deposition of the Si-containing material (as compared to other silicon sources), often at a rate of about 50 Å per minute or higher, preferably about 100 Å per minute or higher, more preferably about 200 Å per minute or higher. Depositions using trisilane can be carried out at even higher deposition rates, e.g., about 400 Å per minute or higher, preferably about 800 Å per minute or higher, even more preferably about 1,000 Å per minute or higher. Preferably, a dopant hydride source is also delivered to the surface along with the trisilane and carbon source to improve surface quality and to provide in situ doping.

Preferred Si-containing films have a thickness that is highly uniform across the surface of the film. When deposition is conducted using trisilane as described herein, the percent thickness non-uniformity for the resulting Si-containing films is preferably about 2% or less. Depending on the mean thickness of the film, additional values for percent thickness non-uniformity may be preferred as shown in Table 1 below. Each value for % thickness non-uniformity shown in Table 1 is to be understood as if preceded by the word "about."

TABLE 1

| Mean Film Thickness | Preferred Range of % Thickness Non-Uniformity | More Preferred Range of % Thickness Non-Uniformity | Most Preferred Range of % Thickness Non-Uniformity |
|---|---|---|---|
| >150 Å | <10 | <6 | <2 |
| 100-150 Å | <10 | <7 | <3 |
| 50-99 Å | <15 | <8 | <4 |
| <50 Å | <20 | <10 | <5 |

In general, measurements of film thickness uniformity for a film deposited under a particular set of process conditions can be made by depositing the film on a uniform or mixed substrate having a diameter in the range of about 200 mm to about 300 mm. Film thickness uniformity is determined by making multiple-point thickness measurements along a randomly selected diameter (with no measurements being taken within a 3 mm exclusion zone at the wafer periphery), determining the mean thickness by averaging the various thickness measurements, and determining the root mean square (rms) variability. A preferred instrument for measuring film thickness utilizes an Optiprobe™ from Thermawave, and a preferred measurement method involves using such an instrument to measure the film thickness at 49 points along a randomly selected wafer diameter. In practice, thickness variability is typically obtained directly from the instrument following such a measurement, and thus need not be calculated manually. To enable comparisons, the results can be expressed as percent non-uniformity, calculated by dividing the rms thickness variability by the mean thickness and multiplying by 100 to express the result as a percentage. When measuring thickness uniformity of a film having a surface that is not accessible to such a measurement, e.g., a film onto which one or more additional layers have been applied, or a film contained within an integrated circuit, the film is cross sectioned and examined by electron microscopy. The film thickness is measured at the thinnest part of the cross sectioned film and at the thickest part, and the range in thickness measurements (e.g., ±6 Å) between these two points is then divided by the sum of the two measurements. This non-uniformity is expressed as a percentage herein.

In addition, the compositional uniformity of preferred crystalline Si-containing films that contain other elements (e.g., doped silicon, Si-containing Si:C and SiGe alloys, and doped Si-containing alloys) made in accordance with the methods described herein is materially improved as compared to corresponding films made without the use of trisilane. This invention is not bound by any theory of operation, but it is believed that the Si-containing films have a degree of compositional uniformity that is better than corresponding Si-containing films deposited using conventional precursors such as silane, dichlorosilane (DCS) or trichlorosilane (TCS).

Furthermore, crystalline (e.g., single crystalline or polycrystalline) Si-containing alloys containing relatively high levels of non-silicon element(s) can be prepared by the methods described herein. For example, crystalline Si:C preferably contains between about 1 atomic % and about 3.5 atomic % of substitutional carbon.

In accordance with another aspect of the invention, for selective deposition embodiments a non-hydrogen carrier gas is preferably employed in combination with a substitutional dopant precursor (e.g., a carbon source), etchant gas and trisilane gas, as described above. Hydrogen gas ($H_2$) is the most popular carrier gas employed in vapor deposition for semiconductor processing, and particularly in epitaxial deposition. There are several reasons for the popularity of $H_2$. $H_2$ can be provided with a high degree of purity. Furthermore, the thermal properties of hydrogen are such that it does not have as great a thermal effect on the wafer. Additionally, hydrogen has a tendency to act as a reducing agent, such that it combats the formation of native oxide that results from less than perfect sealing of the reaction chamber.

However, particular advantages have now been found from employing a non-hydrogen carrier gas in the substitutional dopant precursor/trisilane/chlorine deposition system described herein. Preferably helium (He), argon (Ar), neon (Ne), xenon (Xe) or nitrogen gas ($N_2$), or a combination of such inert gases, is employed in place of hydrogen. In the illustrated embodiment, He is employed, as it has thermal behavior close to that of $H_2$ and thus entails less tuning of the reactor for the adjustment from use of $H_2$ carrier gas.

There are a number of possible reaction mechanisms in the trisilane/chlorine/hydrogen system described hereinabove, including the following:

$$Si(s) + Cl_2(g) \rightarrow SiCl_2(g) \text{ etching} \tag{1}$$

$$Si_3H_8(g) \rightarrow H_3SiSiH{:}(g) + SiH_4(g) \text{ trisilane dissociation} \tag{2}$$

$$H_3SiSiH{:}(g) \rightarrow H_2Si{=}SiH_2(g) \tag{3}$$

$$SiH_2(g) + SiCl_2(s) \rightarrow 2\,Si(s) + 2\,HCl(g) \text{ deposition} \tag{4}$$

$$Si(s) + 2\,HCl \leftrightarrow SiCl_2(g) + H_2(g) \text{ balance of deposition and etching} \tag{5}$$

$$2\,PH_3(g) \rightarrow 2\,P(s) + 3\,H_2(g) \text{ doping} \tag{6}$$

$$PH_3(g) + 6\,Cl(s) \rightarrow PCl_3(g) + 3\,HCl(g) + \text{free surface sites} \tag{7}$$

$$Cl_2(g) + H_2(g) \rightarrow 2\,HCl(g) \tag{8}$$

Comparison: $SiH_2Cl_2(g) \rightarrow SiCl_2(g) + H_2(g)$ DCS decomposition

Equation (1) represents an etching reaction in the system. In addition to providing etching (which is needed for selectivity to be maintained), equation (1) also produces a reactant for equation (5) that will tend to produce silicon deposition. Equation (5) represents a balance between reaction to the right (etching) and reaction to the left (deposition). Preferably conditions are such that etching dominates over insulating surfaces while deposition dominates over semiconductor windows. Without wanting to be limited by theory, it is desirable to provide a sufficient concentration of chlorine gas to produce etching for selectivity, while producing $SiCl_2$ that provides for deposition.

However, when free $H_2$ is present as a carrier gas (i.e., in large quantities), reaction (8) will take place, generating HCl. Increasing the concentration of HCl in the system drives both deposition/etch equations (4) and (5) in the direction of etching, thus driving down deposition rates for any given "tuned" process. A tuned process represents one in which the reactant concentrations have been tuned to achieve selective deposition.

Equation (7) illustrates yet another desirable reaction that is depressed by generation of HCl due to the presence of $H_2$ carrier gas. Equation (7) illustrates gettering of chloride adsorbed on the wafer surface. Dopant hydrides, such as arsine, phosphine and diborane (phosphine shown) tend to react with surface chlorine atoms and form volatile byproduct(s), such that surface reaction sites are freed for depositions. As with equations (4) and (5), however, increasing the HCl concentration tends to depress the desirable gettering reaction by shifting the equilibrium for equation (7) to the left.

Accordingly, the use of a non-hydrogen carrier gas (which is generally the dominant gas in the system) will avoid the consumption of $Cl_2$ by equation (8), thereby avoiding depressing the deposition reactions (4), (5) and the gettering reaction (7). The plots shown in FIG. 15, reproduced from Violette et al., J. Electrochem. Soc., Vol. 143 (1996), pp. 3290-3296 and O'Neill et al., J. Electrochem. Soc., Vol. 144 (1997), pp. 3309-3315, illustrate how the addition of $H_2$ carrier gas depresses the concentration of deposition reactant $SiCl_2$ in the Si/Cl system of their studies. Note that, while the process preferably employs no $H_2$, the benefits of minimizing $H_2$ can be obtained without total exclusion. Preferably the main carrier gas, representing the largest source of gas in the system is non-hydrogen.

Figure 16:
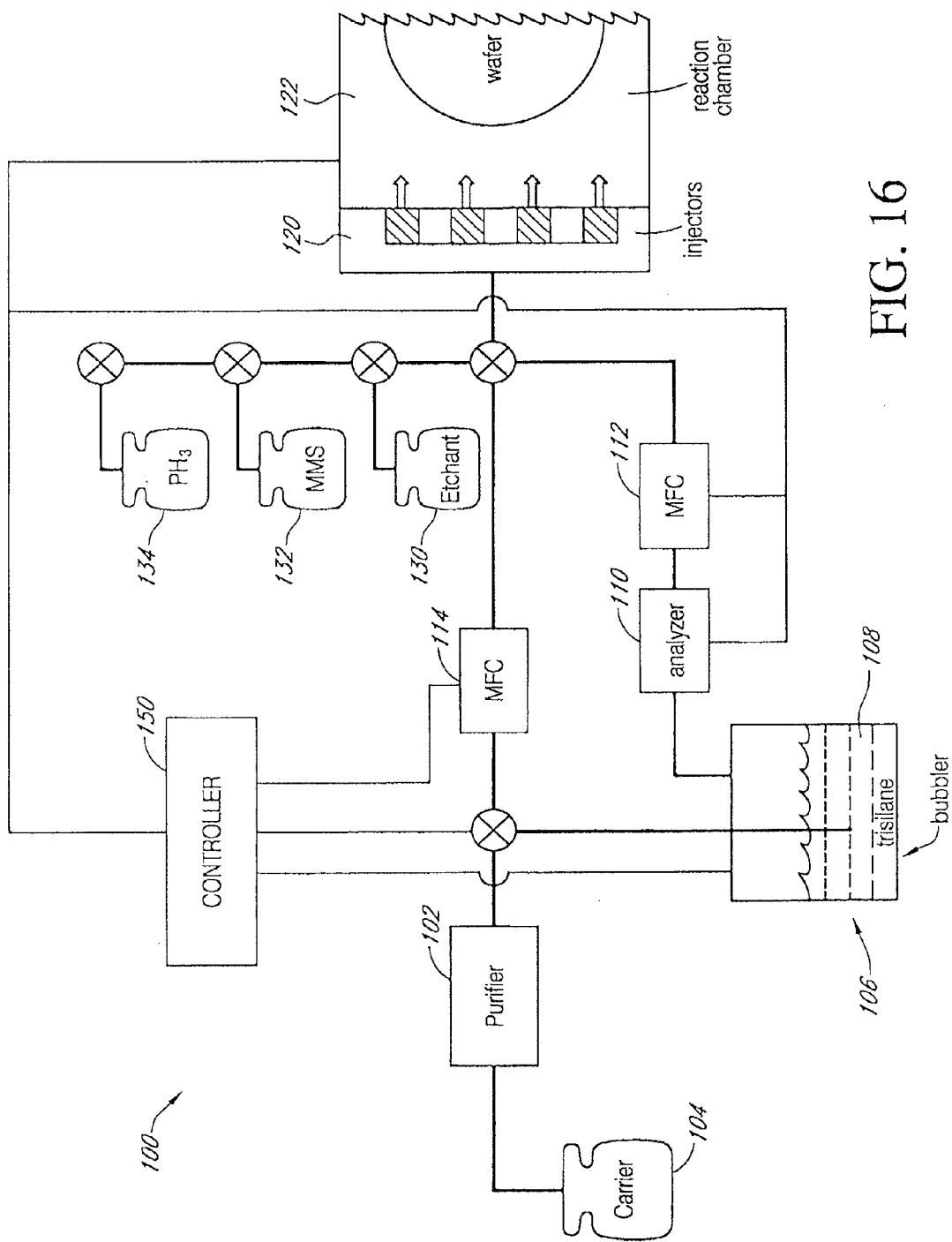
FIG. 16 is a schematic view of a reactor set up for a system employing trisilane, a carbon source, an etchant gas, and a carrier gas for selectively depositing silicon-containing films in accordance with a preferred embodiment.

FIG. 16 illustrates a preferred reactor system 100 employing a carrier gas (helium in the illustrated embodiment), a carbon source (MMS in the illustrated embodiment), trisilane and an etching gas ($Cl_2$ in the illustrated embodiment). As shown, a purifier 102 is positioned downstream of the carrier gas source 104. Some of the inert gas flow is shunted to a vaporizer in the form of a bubbler 106, from which the carrier gas carries vaporized trisilane 108. Alternatively, the trisilane can be simply heated to increase the vapor pressure of trisilane in the space above the liquid, and the carrier gas picks up trisilane as it passes through that space. In any case, downstream of the liquid reactant source container 106 is an analyzer 110 that determines, by measuring the speed of sound through the vapor, the reactant concentration of the flowing gas. Based upon that measurement, the setpoint for the software-controlled downstream mass flow controller (MFC) 112 is altered by the analyzer 110. Such analyzers are commercially available.

The flow through this MFC 112 merges with the main carrier gas through the main carrier gas MFC 114 and other reactants at the gas panel, upstream of the injection manifold 120 for the deposition chamber 122. A source of etchant gas 130 is also optionally provided for selective deposition processes, preferably $Cl_2$ gas. In the illustrated embodiment, a carbon source 132 (illustrated as MMS) and a source for dopant hydride 134 (phosphine shown) are also provided.

As illustrated, the reactor system 100 also includes a central controller 150, electrically connected to the various controllable components of the system 100. The controller is programmed to provide gas flows, temperatures, pressures, etc., to practice the deposition processes as described herein upon a substrate housed within the reaction chamber 122. As will be appreciated by the skilled artisan, the controller 150 typically includes a memory and a microprocessor, and may be programmed by software, hardwired or a combination of the two, and the functionality of the controller may be distributed among processors located in different physical locations. Accordingly, the controller 150 can also represent a plurality of controllers distributed through the system 100.

Accordingly, the combination of carbon source/trisilane results in enhanced deposition rates for silicon-containing materials, particularly epitaxial layers. In one embodiment, the gas flow rates are selected, in combination with pressure and temperature, to achieve selective deposition of Si:C on/in semiconductor windows among insulating material.

In the illustrated embodiment, with the carbon source 132 in combination with trisilane and chlorine, selective deposition of high substitutional carbon content Si:C can be achieved, as disclosed hereinabove. In another embodiment, the dopant hydride source 134 is preferably also provided to produce in situ doped semiconductor layers with enhanced conductivity. Preferably, for Si:C epitaxy, the dopant hydride is arsine or phosphine, and the layer is n-type doped. More preferably, for selective deposition embodiments, the diluent inert gas for the dopant hydride is also a non-hydrogen inert gas. Thus, phosphine and MMS are preferably stored at their source containers 132, 134 in, e.g., helium. Typical dopant hydride concentrations are 0.1% to 5% in helium, more typically 0.5% to 1.0% in helium for arsine and phosphine. Typical carbon source concentrations are 5% to 50% in helium, more typically 10% to 30% in helium. For example, experiments are being conducted with 20% MMS in helium.

The foregoing discussion about the benefits of non-hydrogen inert carrier gases in combination with a carbon source, trisilane and chlorine gas is also applicable to other semiconductor compounds. For example, trisilane, germane, chlorine and a non-hydrogen carrier gas will obtain the same enhanced and selective deposition benefits for SiGe. For example, a p-type doped layer can be obtained with the addition of 1% diborane in helium.

EXAMPLE 1

An eight-inch unpatterned Si<100> wafer substrate was loaded into an Epsilon E2500™ reactor system. The substrate was then introduced into the reactor system at 900° C., at a hydrogen flow rate of 20 slm, and the substrate was allowed to stabilize for 1 minute. The hydrogen flow was then reduced to 2 slm as the temperature of the substrate was reduced to 550° C. The substrate was then allowed to stabilize for 10 seconds, after which time a flow of 50 mg/min of trisilane and 40 sccm of MMS was introduced for 7.5 minutes. A flow of 100 sccm phosphine (1% in $H_2$) was simultaneously provided and the deposition was conducted at a deposition pressure of about 64 Torr. A continuous, uniform phosphorous-doped Si:C film having a thickness of about 210 nm (XRD) was deposited (deposition rate of about 28 nm/min) over the single crystal substrate. The substrate was then removed from the reactor and returned to the loadlock. The phosphorous-doped Si:C film deposited on the silicon wafer had excellent epitaxial quality, a resistivity of 0.8 mΩ·cm (center) and contained about 3.5 atomic % carbon.

EXAMPLE 2

A phosphorous-doped Si:C film was deposited in the manner described in Example 1 except that a patterned substrate having single crystal regions and insulator (oxide) regions was used. The phosphorous-doped Si:C film formed over both the single crystal and the insulator regions, and had substantially the same thickness (about 200 nm) over both.

All patents, patent applications and papers mentioned herein are hereby incorporated by reference in their entireties. It will be appreciated by those skilled in the art that various omissions, additions and modifications may be made to the processes described above without departing from the scope of the invention, and all such modifications and changes are intended to fall within the scope of the invention, as defined by the appended claims.

What is claimed is:

1. A doped single crystalline silicon film comprising substitutional carbon, the single crystalline silicon film having a lattice spacing of 5.38 Å or less and less than about 0.3 atomic % non-substitutional carbon.

2. The doped single crystalline silicon film of claim 1, wherein the lattice spacing is 5.36 Å or less.

3. The doped single crystalline silicon film of claim 1, wherein the lattice spacing is 5.34 Å or less.

4. The doped single crystalline silicon film of claim 1, further comprising a dopant selected from the group consisting of phosphorous and arsenic.

5. The doped single crystalline silicon film of claim 4, having a resistivity of about 1.0 mΩ·cm or less.

6. The doped single crystalline silicon film of claim 4, having a resistivity of about 0.7 mΩ·cm or less.

7. A single crystalline silicon film comprising 2.4 atomic % or greater substitutional carbon and less than about 0.3 atomic % non-substitutional carbon, as determined by x-ray diffraction and Vegard's Law.

8. The single crystalline silicon film of claim 7, comprising 2.7 atomic % or greater substitutional carbon.

9. The single crystalline silicon film of claim 7, comprising 3.0 atomic % or greater substitutional carbon.

10. The single crystalline silicon film of claim 7, comprising less than about 0.2 atomic % non-substitutional carbon.

11. The single crystalline silicon film of claim 7, having a tensile stress of about 1.0 GPa or greater.

12. The single crystalline silicon film of claim 11, having a tensile stress of about 1.5 GPa or greater.

13. The single crystalline silicon film of claim 11, having a tensile stress of about 1.7 GPa or greater.

14. The single crystalline silicon film of claim 11, having a tensile stress of about 1.85 GPa or greater.

15. The single crystalline silicon film of claim 11, having a tensile stress of about 2.0 GPa or greater.

16. The single crystalline silicon film of claim 7, having a film thickness of about 200 nm or less.

17. The single crystalline silicon film of claim 7, further comprising an underlying single crystalline silicon substrate.

18. The single crystalline silicon film of claim 17, wherein the underlying single crystalline silicon substrate has a lattice spacing of about 5.43 Å.

19. The single crystalline silicon film of claim 17, recessed in the underlying single crystalline silicon substrate.

20. A single crystalline silicon film comprising 3.0 atomic % or greater substitutional carbon, as determined by x-ray diffraction and Vegard's Law.

21. The single crystalline silicon film of claim 20, comprising less than about 0.2 atomic % non-substitutional carbon.

22. The single crystalline silicon film of claim 20, having a tensile stress of about 1.0 GPa or greater.

23. The single crystalline silicon film of claim 20, having a tensile stress of about 1.5 GPa or greater.

24. The single crystalline silicon film of claim 20, having a tensile stress of 1.7 GPa or greater.

25. The single crystalline silicon film of claim 20, having a tensile stress of 1.85 GPa or greater.

26. The single crystalline silicon film of claim 20, further comprising an underlying single crystalline silicon substrate.

27. The single crystalline silicon film of claim 25, wherein the underlying single crystalline silicon substrate has a lattice spacing of about 5.34 Å.

* * * * *

UNITED STATES PATENT AND TRADEMARK OFFICE
CERTIFICATE OF CORRECTION

| | | |
|---|---|---|
| PATENT NO. | : 7,648,690 B2 | Page 1 of 1 |
| APPLICATION NO. | : 12/244724 | |
| DATED | : January 19, 2010 | |
| INVENTOR(S) | : Bauer et al. | |

It is certified that error appears in the above-identified patent and that said Letters Patent is hereby corrected as shown below:

In Claim 27, at column 26, line 35, please replace "5.34." with -- 5.43. --

Signed and Sealed this

Sixth Day of July, 2010

David J. Kappos
*Director of the United States Patent and Trademark Office*